US012628715B2

(12) United States Patent
Hosokawa et al.

(10) Patent No.: US 12,628,715 B2
(45) Date of Patent: May 12, 2026

(54) SEMICONDUCTOR DEVICE

(71) Applicant: RENESAS ELECTRONICS CORPORATION, Tokyo (JP)

(72) Inventors: Takamichi Hosokawa, Tokyo (JP);
Tatsuaki Tsukuda, Tokyo (JP);
Yoshihiro Masumura, Tokyo (JP)

(73) Assignee: Renesas Electronics Corporation,
Tokyo (JP)

( * ) Notice: Subject to any disclaimer, the term of this
patent is extended or adjusted under 35
U.S.C. 154(b) by 385 days.

(21) Appl. No.: 18/482,235

(22) Filed: Oct. 6, 2023

(65) Prior Publication Data

US 2024/0203844 A1 Jun. 20, 2024

(30) Foreign Application Priority Data

Dec. 19, 2022 (JP) ................................. 2022-202056

(51) Int. Cl.
*H01L 23/495* (2006.01)
*H01F 17/00* (2006.01)
*H01F 19/04* (2006.01)
*H01F 38/16* (2006.01)
*H01L 23/00* (2006.01)
(Continued)

(52) U.S. Cl.
CPC ... *H01L 23/49575* (2013.01); *H01F 17/0006*
(2013.01); *H01L 23/3107* (2013.01); *H01L*
*23/49503* (2013.01); *H01L 24/05* (2013.01);
*H01L 24/06* (2013.01); *H01L 24/48* (2013.01);
*H01L 2224/04042* (2013.01); *H01L*
*2224/06177* (2013.01); *H01L 2224/48245*
(2013.01)

(58) Field of Classification Search
CPC ........... H01L 23/49575; H01L 23/3107; H01L
23/49503; H01L 23/49541; H01L 23/645;
H01L 24/05; H01L 24/06; H01L 24/48;
H01L 24/49; H01L 25/16; H01F 17/0006;
H01F 19/04; H01F 19/00; H01F 38/16
See application file for complete search history.

(56) References Cited

U.S. PATENT DOCUMENTS 9,711,451 B2 7/2017 Igarashi et al.
2010/0019391 A1* 1/2010 Strzalkowski .... H01L 23/49575
257/777

(Continued)

FOREIGN PATENT DOCUMENTS

WO 2015/114758 A1 8/2015

*Primary Examiner* — Omar F Mojaddedi
(74) *Attorney, Agent, or Firm* — Rimon P.C.

(57) ABSTRACT

A semiconductor device includes: a first chip mounting
portion and a second chip mounting portion adjacent to each
other in a first direction; a first semiconductor chip and a
third semiconductor chip adjacent to each other in a second
direction and mounted on the first chip mounting portion;
and a second semiconductor chip mounted on the second
chip mounting portion. The third semiconductor has: one or
more first transformers used to transmit a signal from the
first semiconductor chip to the second semiconductor chip;
and one or more second transformers used to transmit a
signal from the second semiconductor chip to the first
semiconductor chip. In plan view, the first and second
transformers are arranged along a side facing the second
semiconductor chip, and the one of more first transformers
are arranged closer to the first semiconductor chip than the
one of more second transformers.

18 Claims, 28 Drawing Sheets

(51) Int. Cl.
    *H01L 23/31*     (2006.01)
    *H01L 25/16*     (2023.01)

(56)         References Cited

U.S. PATENT DOCUMENTS

2018/0366409 A1*  12/2018  Kuwabara ........... H01L 25/0655
2019/0333866 A1*  10/2019  Tsukuda ............. H01L 23/5383
2022/0077081 A1*   3/2022  Kurita .................. H01L 23/645
2022/0223332 A1*   7/2022  Imasaka ............. H01F 27/2804

* cited by examiner

SEMICONDUCTOR DEVICE

CROSS-REFERENCE TO RELATED APPLICATIONS

The disclosure of Japanese Patent Application No. 2022-202056 filed on Dec. 19, 2022, including the specification, drawings and abstract is incorporated herein by reference in its entirety.

BACKGROUND

The present disclosure relates to a semiconductor device, and can be suitably used, for example, for a semiconductor device incorporating a plurality of semiconductor chips.

Here, there are disclosed techniques listed below. [Patent Document 1] PCT International Publication No. 2015-114758

A semiconductor device in the form of a semiconductor package can be manufactured by mounting a semiconductor chip on a die pad, by electrically connecting a pad electrode of the semiconductor chip with a lead via a wire, and by resin sealing them.

Patent Document 1 discloses a technique in which two coils in a semiconductor chip are inductively coupled to each other, thereby transmitting an electric signal.

SUMMARY

In a semiconductor device in which a signal is transmitted between two of three semiconductor chips by using two coils, which are magnetically coupled to each other, provided in another one of the three semiconductor chips, it would be required to improve a performance thereof.

Other objects and novel features will become apparent from the description of this specification and the accompanying drawings.

A semiconductor device according to an embodiment, includes: a first chip mounting portion; a second chip mounting portion; a first semiconductor chip mounted on the first chip mounting portion; a second semiconductor chip mounted on the second chip mounting portion; a third semiconductor chip mounted on the first chip mounting portion and having a plurality of transformers; and a sealing body sealing the first semiconductor chip, the second semiconductor chip, the third semiconductor chip, the first chip mounting portion and the second chip mounting portion. Here, each of the plurality of transformers has a primary coil and a secondary coil that are magnetically coupled to each other. Also, the first chip mounting portion and the second chip mounting portion are adjacent to each other in a first direction. Also, the first semiconductor chip and the third semiconductor chip are adjacent to each other in a second direction that is perpendicular to the first direction. Also, in plan view, the third semiconductor chip has: a third side facing a first side of the first semiconductor chip; and a fourth side facing a second side of the second semiconductor chip. Also, in plan view, the plurality of transformers is arranged along the fourth side of the third semiconductor chip. Also, the first semiconductor chip has: a plurality of first transmitting pads electrically connected with a first transmitting circuit formed in the first semiconductor chip; and a plurality of first receiving pads electrically connected with a first receiving circuit formed in the first semiconductor chip. Also, the second semiconductor chip has: a plurality of second transmitting pads electrically connected with a second transmitting circuit formed in the second semiconductor chip; and a plurality of second receiving pads electrically connected with a second receiving circuit formed in the second semiconductor chip. Also, the plurality of transformers of the third semiconductor chip has: at least one or more first transformers used to transmit a signal from the first semiconductor chip to the second semiconductor chip; and at least one or more second transformers used to transmit a signal from the second semiconductor chip to the first semiconductor chip. Also, the primary coil of the one of more first transformers is electrically connected with the plurality of first transmitting pads of the first semiconductor chip. Also, the secondary coil of the one of more first transformers is electrically connected with the plurality of second receiving pads of the second semiconductor chip. Also, the primary coil of the one of more second transformers is electrically connected with the plurality of second transmitting pads of the second semiconductor chip. Also, the secondary coil of the one of more second transformers is electrically connected with the plurality of first receiving pads of the first semiconductor chip. Also, in plan view, the one of more first transformers are arranged closer to the first semiconductor chip than the one of more second transformers. Further, in plan view, the plurality of first transmitting pads is arranged closer to the second semiconductor chip than the plurality of first receiving pads.

According to one embodiment, the performance of the semiconductor device can be improved. In addition, it is possible to reduce the size of the semiconductor device.

BRIEF DESCRIPTION OF THE DRAWINGS

FIG. 1 is a circuit diagram showing an inverter circuit using a semiconductor device according to an embodiment.

FIG. 3 is a perspective plan view of the semiconductor device according to the embodiment.

FIG. 4 is a perspective plan view of the semiconductor device according to the embodiment.

FIG. 10 is a plan view during a manufacturing process of the semiconductor device according to the embodiment.

FIG. 11 is a plan view during the manufacturing process of the semiconductor device following FIG. 10.

FIG. 12 is a plan view during the manufacturing process of the semiconductor device following FIG. 11.

FIG. 13 is a plan view during the manufacturing process of the semiconductor device following FIG. 12.

FIG. 21 is a perspective plan view of a semiconductor device according to an examined example.

DETAILED DESCRIPTION

Figure 2:
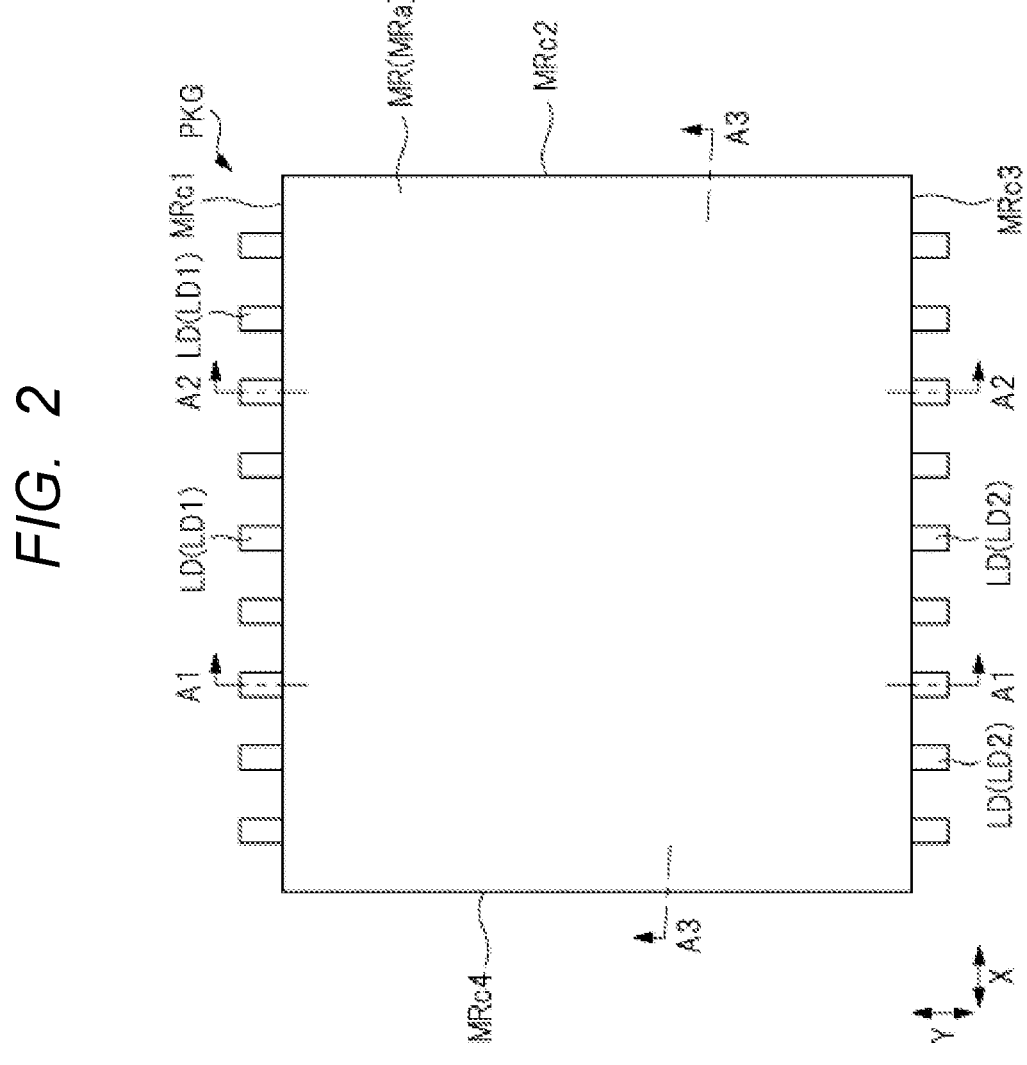
FIG. 2 is an upper surface view of the semiconductor device according to the embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The embodiments will be described in detail on the basis of drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

First Embodiment

<Circuit Configuration>

Figure 1:
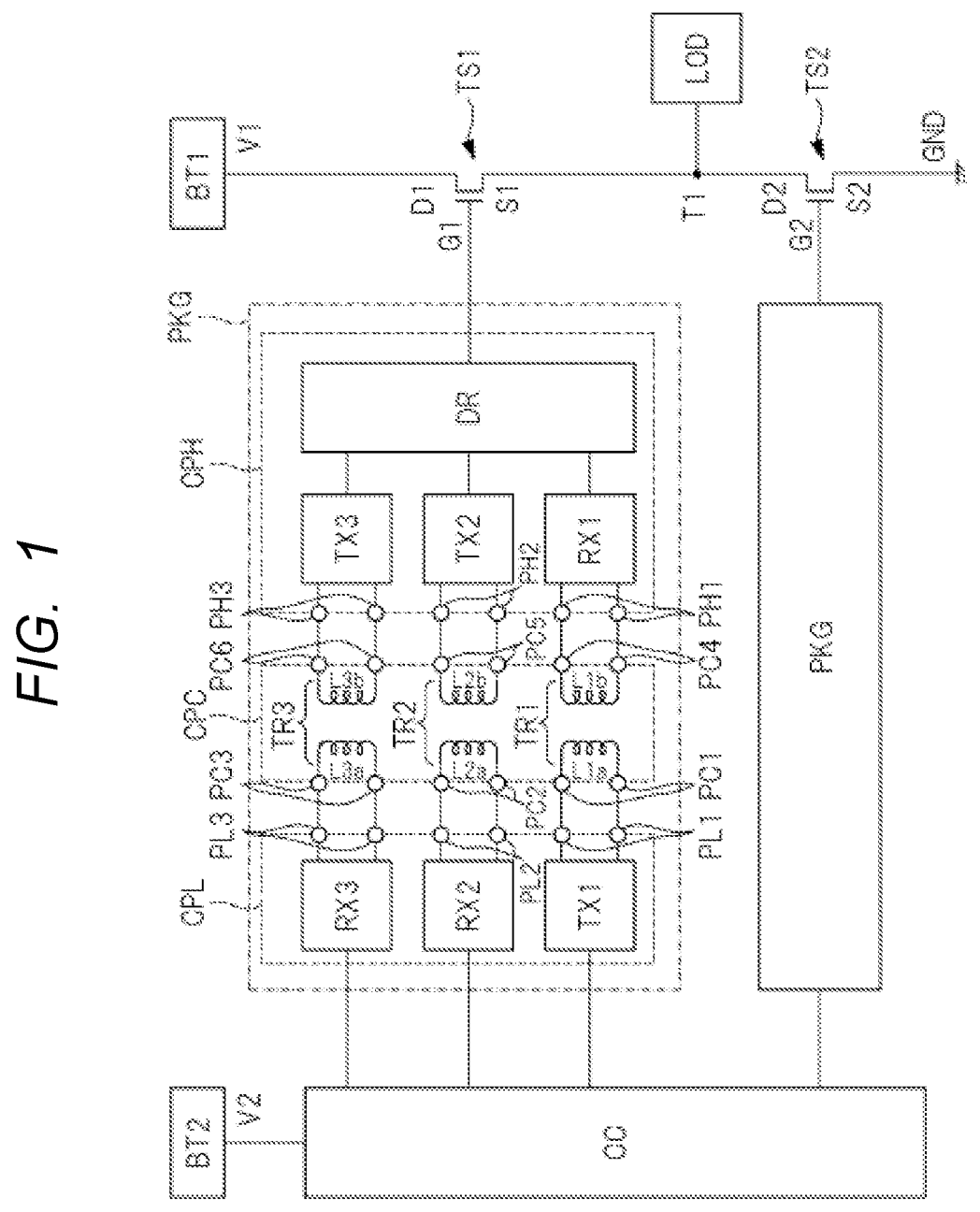

FIG. 1 is a circuit diagram showing an inverter circuit using a semiconductor device PKG according to the present embodiment. Note that, in FIG. 1, a portion surrounded by a dotted line with reference numeral CPH is formed in a semiconductor chip CPH, a portion surrounded by a dotted line with reference numeral CPL is formed in a semiconductor chip CPL, a portion surrounded by a dotted line with reference numeral CPC is formed in a semiconductor chip CPC, and a portion surrounded by a dashed-dotted line with reference numeral PKG is formed in the semiconductor device PKG. In the inverter circuit shown in FIG. 1, two semiconductor devices PKG are used. In FIG. 1, the circuit configuration of the semiconductor device PKG connected to the power transistor TS2 is omitted for the sake of simplifying of the drawing, but the circuit configuration of the semiconductor device PKG connected to the power transistor TS2 is basically the same as the circuit configuration of the semiconductor device PKG connected to the power transistor TS1.

The semiconductor device PKG used in the inverter circuit shown in FIG. 1 includes the semiconductor chip CPC,CPL,CPH. A transmitting circuit TX1, a receiving circuit RX2, and a receiving circuit RX3 are formed in the semiconductor chip CPL. In the semiconductor chip CPH, a receiving circuit RX1, a transmitting circuit TX2, a transmitting circuit TX3, and a drive circuit (control circuit) DR are formed. In the semiconductor chip CPC, a transformer TR1 made of coil L1a,L1b magnetically coupled to each other, a transformer TR2 made of coil L2a,L2b magnetically coupled to each other, and a transformer TR3 made of coil L3a,L3b magnetically coupled to each other are formed. The receiving circuit RX2 and the receiving circuit RX3 are formed on the same semiconductor chip CPL, and therefore, the entire receiving circuit RX2 and the receiving circuit RX3 can be regarded as a reception circuit. The transmitting circuit TX2 and the transmitting circuit TX3 are formed on the same semiconductor chip CPH, and thus the transmitting circuit TX2 and the transmitting circuit TX3 can be regarded as the transmitting circuit in its entirety. The inverter circuit shown in FIG. 1 also has a control circuit CC, and the control circuit CC is formed in another semiconductor chip provided outside the semiconductor package PKG.

The transmitting circuit TX1 and the receiving circuit RX1 are circuits for transmitting signals from the control circuit CC to the driving circuit DR. The transmitting circuit TX1 converts the signal sent from the control circuit CC to the transmitting circuit TX1, and transmits the converted signal to the receiving circuit RX1 via the transformer TR1. The receiving circuit RX1 converts the signal received from the transmitting circuit TX1 via the transformer TR1 and transmits the converted signal to the drive circuit DR. The transmitting circuit TX2 and the receiving circuit RX2 are circuits for transmitting signals from the driving circuit DR to the control circuit CC. The transmitting circuit TX2 converts the signal sent from the drive circuit DR to the transmitting circuit TX2, and transmits the converted signal to the receiving circuit RX2 via the transformer TR2. The receiving circuit RX2 converts the signal received from the transmitting circuit TX2 via the transformer TR2 and transmits the converted signal to the control circuit CC. The transmitting circuit TX3 and the receiving circuit RX3 are circuits for transmitting signals from the driving circuit DR to the control circuit CC. The transmitting circuit TX3 converts the signal sent from the drive circuit DR to the transmitting circuit TX3, and transmits the converted signal to the receiving circuit RX3 via the transformer TR3. The receiving circuit RX3 converts the signal received from the transmitting circuit TX3 via the transformer TR3 and transmits the converted signal to the control circuit CC.

The inverter circuit shown in FIG. 1 includes a power transistor TS1,TS2. The power transistor TS1 is a transistor for a high-side switch (high potential side switch), and the power transistor TS2 is a transistor for a low-side switch (low potential side switch). Each of the power transistor TS1 and the power transistor TS2 is formed in a separate semiconductor chip provided outside the semiconductor package PKG.

Hereinafter, the power transistor TS1,TS2 is the power MOSFET (Metal Oxide Semiconductor Field Effect Transistor). As the power transistor TS1,TS2, a IGBT (Insulated Gate Bipolar Transistor) may be applied, and in the following explanation regarding the power transistor TS1,TS2, the "source" may be read as an "emitter" and the "drain" may be read as a "collector".

In the present application, a MOSFET includes not only a MISFET (Metal Insulator Semiconductor Field Effect Transistor: MIS field-effect transistor) including an oxide film (silicon-oxide film) as a gate insulating film but also a MISFET including an insulating film other than the oxide film as a gate insulating film.

The power transistor TS1 and the power transistor TS2 are connected in series, and a source (S1) of the power transistor TS1 is connected to a drain (D2) of the power transistor TS2. The drain (D1) of the power transistor TS1 is supplied with a power supply potential (power supply voltage) V1 from a power supply (battery) BT1. A power supply potential (power supply voltage) V2 is supplied from a power supply (battery) BT2 to the control circuitry CC. The power supply potential V1 supplied to the drains (D1) of the power transistors TS1 is considerably higher than the power supply potential V2 (for example, several V to several tens V) supplied to the control circuitry CC, and is, for example, 100 V or more (several hundred V). A reference potential lower than the power supply potential V1, for example, a ground potential (GND) is supplied to the source (S2) of the power transistor TS2. The gate (G1) of the power transistor TS1 and the gate (G2) of the power transistor TS2 are connected to the driver DR, respectively.

In the present embodiment, the same number of the semiconductor device PKG as the number of power transistors TS1,TS2 is used. Here, the drive circuit DR of the semiconductor device PKG provided for the power transistor TS1 controls the voltage of the gate (G1) of the power transistor TS1, and the voltage of the gate (G2) of the power transistor TS2 is controlled by the drive circuit DR of the semiconductor device PKG provided for the power transistor TS2. Alternatively, one TS1,TS2 of the semiconductor device PKG may be used for the two power transistors, but in this case, the driver DR of the common the semiconductor device PKG controls the voltages of the gates (G1,G2) of the two power transistors.

The operation of the power transistor TR1,TR2 can be controlled by controlling the gate voltage supplied from the drive voltage DR to the gates (G1,G2) of the power transistors TS1,TS2 in accordance with the signal (control signal) supplied from the control circuit CC to the drive circuit via the transmit circuit TX1, the transformer TR1, and the receiving circuit RX1.

A terminal T1 provided between the source (S1) of the power transistor TS1 and the drain (D2) of the power transistor TS2 is a terminal for outputting the inverter. The terminal T1 is connected to the loading LOD. The loading LOD is, for example, a coil of a motor. The DC power supplied to the inverter circuit is converted into AC power by the inverter circuit and supplied to the load LOD.

A transformer TR1 is interposed between the transmitting circuit TX1 and the receiving circuit RX1, a transformer TR2 is interposed between the transmitting circuit TX2 and the receiving circuit RX2, and a transformer TR3 is interposed between the transmitting circuit TX3 and the receiving circuit RX3. The control circuit CC may transmit a signal (control signal) to the drive circuit DR through the transmitting circuit TX1, the transformer TR1, and the receiving circuit RX1. Further, the drive circuit DR may transmit a signal to the control circuit CC via the transmitting circuit TX2, the transformer TR2, and the receiving circuit RX2, and the drive circuit DR may transmit a signal to the control circuit CC via the transmitting circuit TX3, the transformer TR3, and the receiving circuit RX3. Each of the coiled L1a,L1b,L2a,L2b,L3a,L3b can also be regarded as an inductor.

The transformer TR1 is formed by a coil L1a,L1b formed in the semiconductor chip CPC, but the coil L1a and the coil L1b are not connected by conductors but are magnetically coupled to each other. Therefore, when a current flows in the coil L1a, an induced electromotive force is generated in the coil L1b in accordance with a change in the current, and an induced current flows. The coil L1a is a primary coil, and the coil L1b is a secondary coil. Using this, a signal corresponding to the signal transmitted by the transmitting circuit TX1 can be received by the receiving circuit RX1 by transmitting a signal from the transmitting circuit TX1 to the coil L1a (primary coil) of the transformer TR1 to flow a current, and detection (receiving) an induced current (or induced electromotive force) generated in the coil L1b (secondary coil) of the transformer in response to the signal transmitted by the receiving circuit RX1.

Further, the transformer TR2 is formed by a coil L2a,L2b formed in the semiconductor chip CPC, but the coil L2b and the coil L2a are not connected by conductors but are magnetically coupled to each other. Therefore, when a current flows in the coil L2b, an induced electromotive force is generated in the coil L2a in accordance with a change in the current, and an induced current flows. The coil L2b is a primary coil, and the coil L2a is a secondary coil. Using this, a signal corresponding to the signal transmitted by the transmitting circuit TX2 can be received by the receiving circuit RX2 by transmitting a signal from the transmitting circuit TX2 to the coil L2b (primary coil) of the transformer TR2 to flow a current, and detection (receiving) an induced current (or induced electromotive force) generated in the coil L2a (secondary coil) of the transformer in response to the signal transmitted by the receiving circuit RX2.

Further, the transformer TR3 is formed by a coil L3a,L3b formed in the semiconductor chip CPC, but the coil L3b and the coil L3a are not connected by conductors but are magnetically coupled to each other. Therefore, when a current flows in the coil L3b, an induced electromotive force is generated in the coil L3a in accordance with a change in the current, and an induced current flows. The coil L3b is a primary coil, and the coil L3a is a secondary coil. Using this, a signal corresponding to the signal transmitted by the transmitting circuit TX3 can be received by the receiving circuit RX3 by transmitting a signal from the transmitting circuit TX3 to the coil L3b (primary coil) of the transformer TR3 to flow a current, and detection (receiving) an induced current (or induced electromotive force) generated in the coil L3a (secondary coil) of the transformer in response to the signal transmitted by the receiving circuit RX3.

Signaling can be transmitted between the semiconductor chip TX1 and the semiconductor chip TR1 by a path from the transmitting circuit CPL to the receiving circuit RX1 via the transformer CPH, a path from the transmitting circuit TX2 to the receiving circuit RX2 via the transformer TR2, and a path from the transmitting circuit TX3 to the receiving circuit RX3 via the transformer TR3.

The semiconductor chip CPL and the semiconductor chip CPH are different from each other. For example, the semiconductor chip CPL is electrically connected to a low-voltage area having a circuit (for example, the control circuit CC) that is operated or driven at a low voltage (for example, several V to several tens V) via a wire BW and a lead LD (specifically, a lead LD2) which will be described later. Further, the semiconductor chip CPH is electrically connected to a high-voltage area having a circuit (for example, a power transistor TS1,TS2) that is operated or driven at a higher voltage (for example, 100 V or higher) than the low voltage via the wire BW and a lead LD (specifically, a lead LD1) to be described later. However, since the transmission of the signal between the semiconductor chip CPL,CPH is through the transformer TR1,TR2,TR3, the signal can be transmitted between different-voltage circuits.

In FIG. 1, the control circuit CC is incorporated in a semiconductor chip other than the semiconductor chip CPC, CPH,CPL, but as another embodiment, the control circuit CC may be incorporated in the semiconductor chip CPL.

<Structure of the Semiconductor Device>

Figure 3:
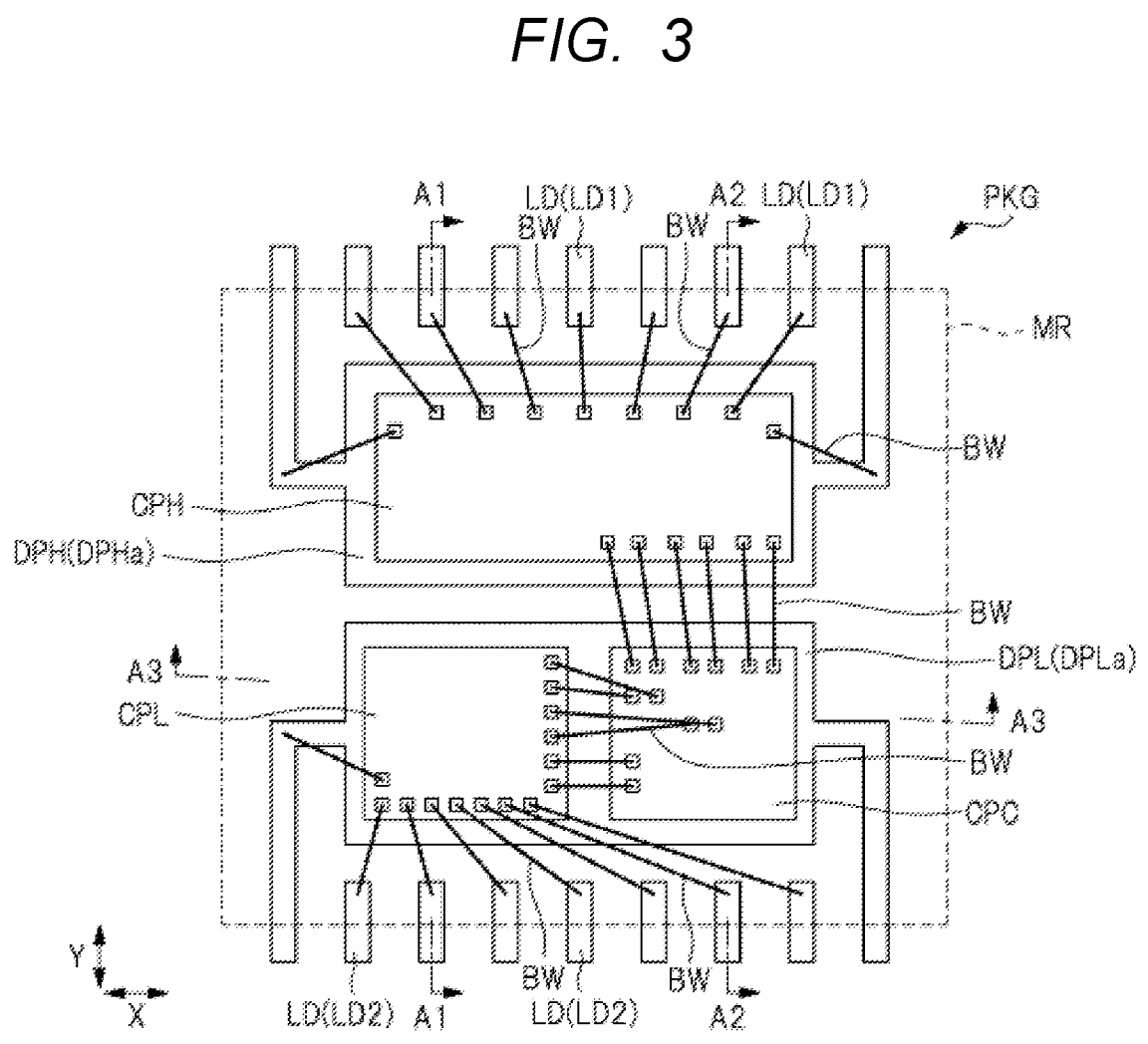
Figure 4:
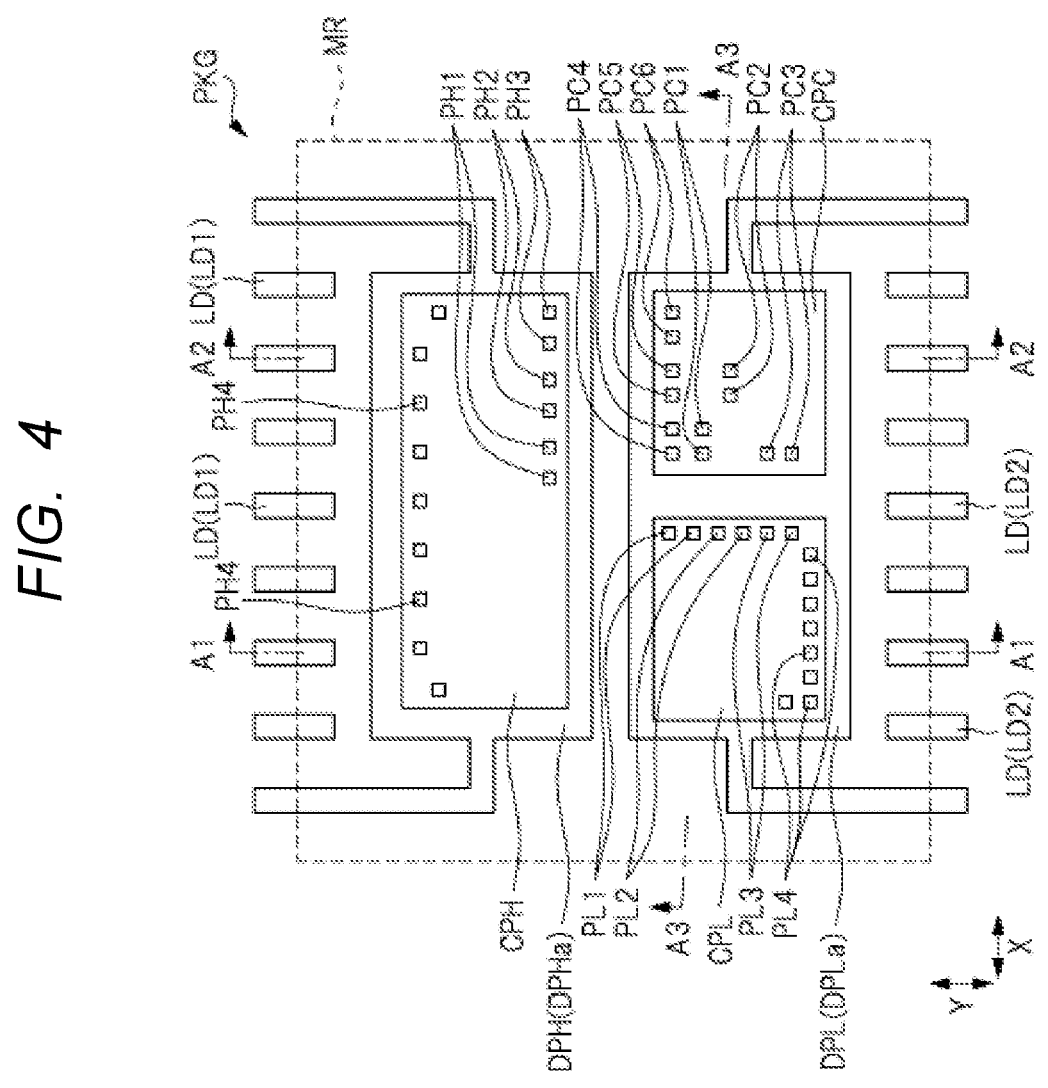
Figure 5:
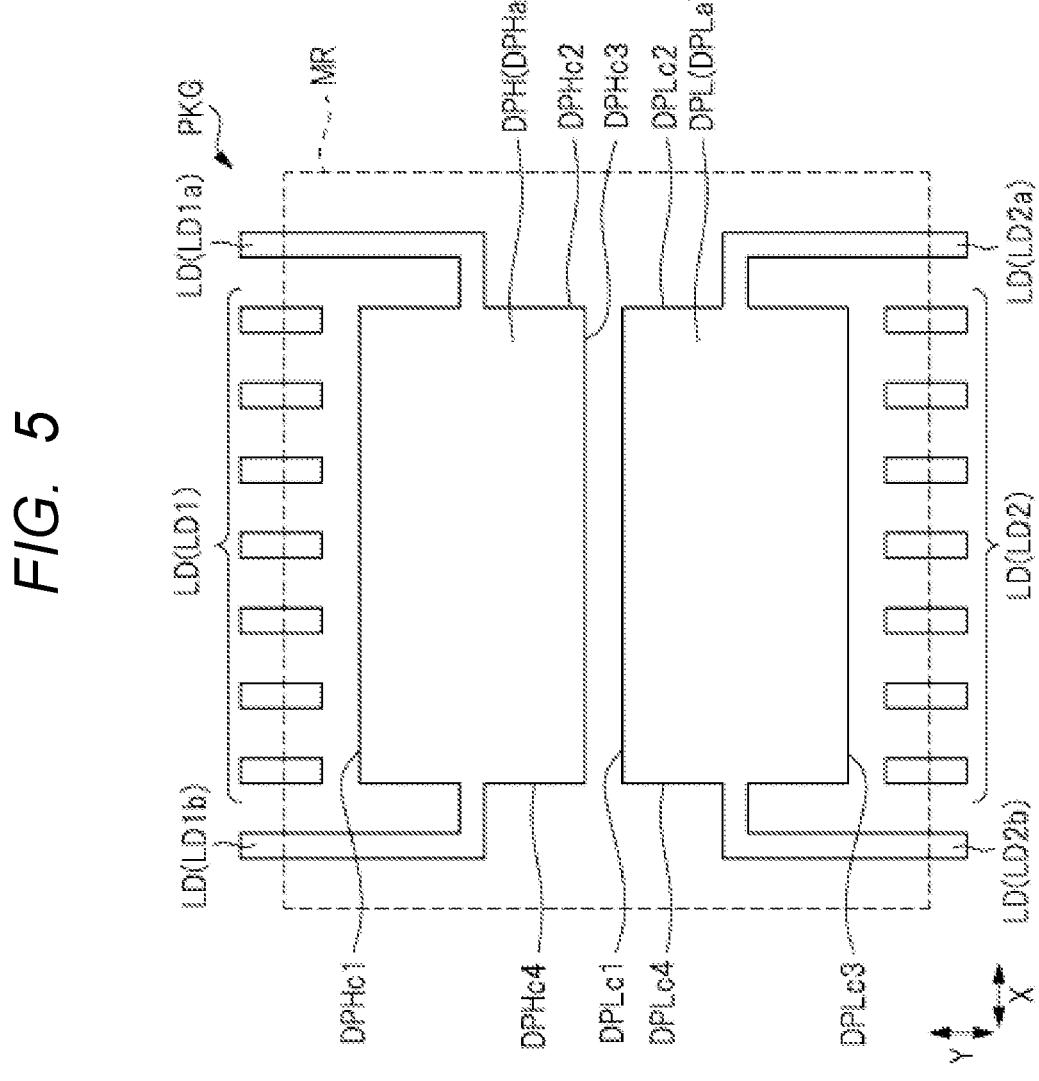
FIG. 5 is a perspective plan view of the semiconductor device according to the embodiment.
Figure 6:
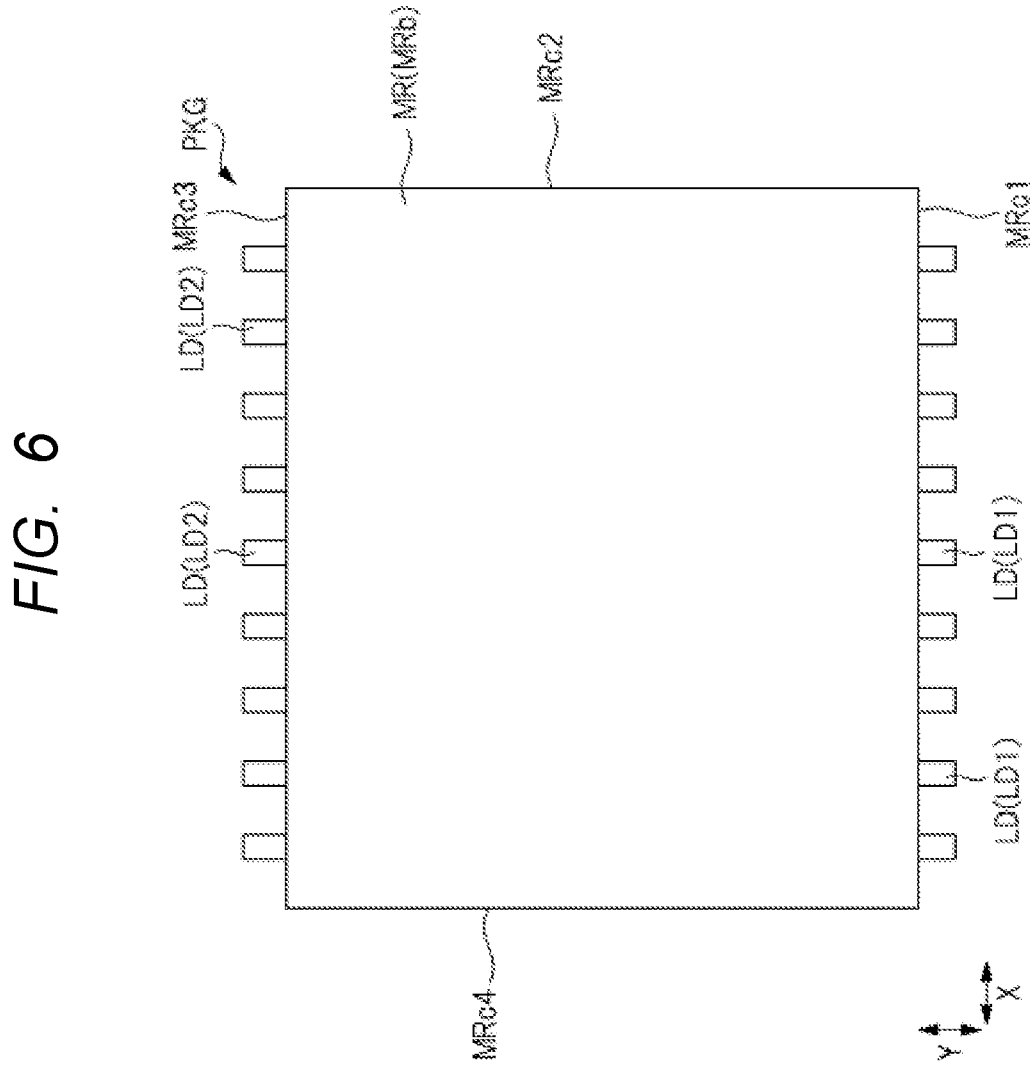
FIG. 6 is a lower surface view of the semiconductor device according to the embodiment.
Figure 7:
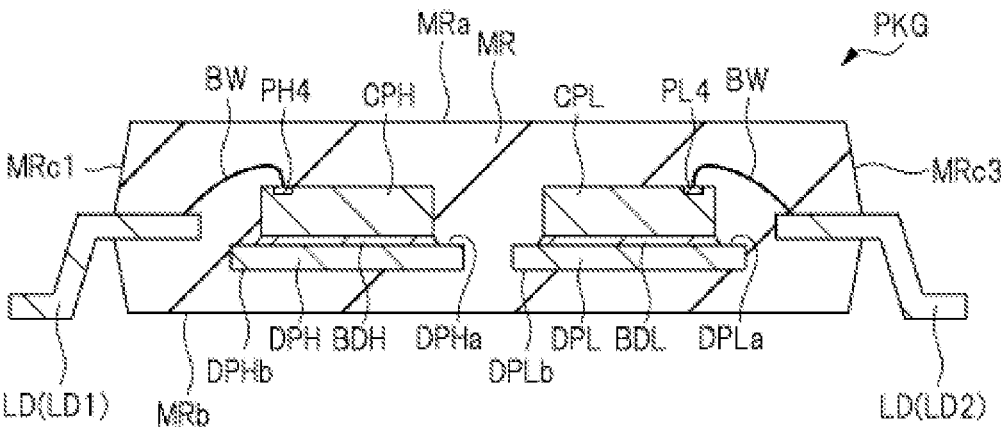
FIG. 7 is a cross-sectional view of the semiconductor device according to the embodiment.
Figure 8:
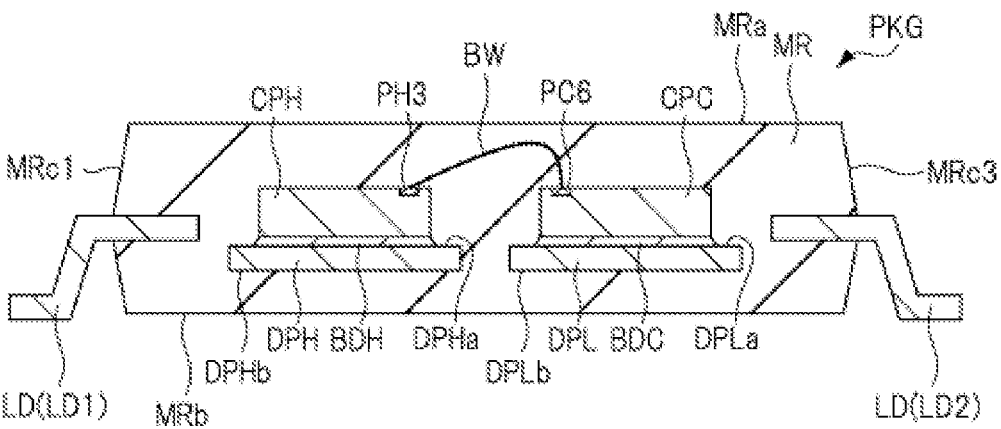
FIG. 8 is a cross-sectional view of the semiconductor device according to the embodiment.
Figure 9:
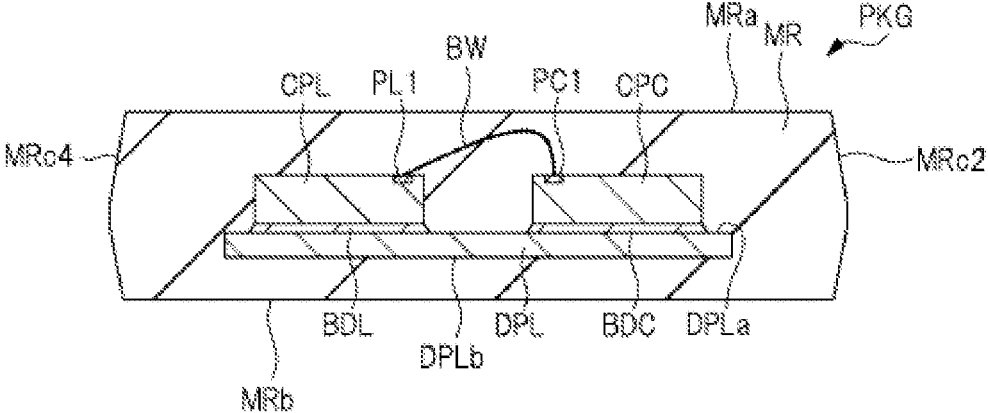
FIG. 9 is a cross-sectional view of the semiconductor device according to the embodiment.

FIG. 2 is an upper surface view of the semiconductor device PKG according to the present embodiment view, FIGS. 3 to 5 are a perspective plan view of the semiconductor device PKG, FIG. 6 is a lower surface view (back surface view) of the semiconductor device PKG, and FIGS. 7 to 9 are a cross-sectional view of the semiconductor device PKG. FIG. 3 is the perspective plan view of the upper surface of the semiconductor device PKG when a sealing portion MR is seen through. FIG. 4 is the perspective plan view of the upper surface of the semiconductor device PKG when the wire BW is seen through (omitted) in FIG. 3. FIG. 5 is the perspective plan view of the upper surface of the semiconductor device PKG when the semiconductor chip CPC,CPH,CPL is seen through (omitted) in FIG. 4. In FIG. 3 to FIG. 5, the position of the outer periphery of the sealing portion MR is indicated by a dotted line. In addition, a cross-sectional view of the semiconductor device PKG at the position of A1-A1 line in FIGS. 2 and 3 substantially corresponds to FIG. 7, a cross-sectional view of the semiconductor device PKG at the position of A2-A2 line in FIGS. 2 and 3 substantially corresponds to FIG. 8, and a cross-sectional view of the semiconductor device PKG at the position of A3-A3 line in FIGS. 2 and 3 substantially corresponds to FIG. 9. In addition, in FIG. 2 to FIG. 6, an X direction and a Y direction are shown. Here, the X direction and the Y direction are directions intersecting with each other, and more specifically, directions perpendicular to each other.

The semiconductor device (semiconductor package) PKG according to the present embodiment shown in FIGS. 2 to 9 is the semiconductor device in the form of a resin sealing typed semiconductor package, here SOP (Small Outline Package). Hereinafter, the configuration of the semiconductor device PKG will be described referring to FIGS. 2 to 9.

The semiconductor device PKG according to the present embodiment shown in FIGS. 2 to 9 has three semiconductor chips CPC,CPH,CPL, a die pad DPL on which two semiconductor chips CPC,CPL are mounted, a die pad DPH on which one semiconductor chip CPH is mounted, a plurality of wires (bonding wires) BW, a plurality of leads LD, and a sealing portion MR for sealing them.

The sealing portion MR as the sealing member is made of, for example, a resin material such as a thermosetting resin material, and may include fillers and the like. For example, the sealing portion MR can be formed using a filler-containing epoxy-resin or the like.

The sealing portion MR has a upper surface MRa which is one main surface, a lower surface (rear surface, bottom surface) MRb which is an opposing main surface of upper surface MRa, and a side surface MRc1,MRc2,MRc3,MRc4 which intersects upper surface MRa and the lower surface MRb. The side surface MRc1,MRc3 is substantially parallel to the X direction, and the side surface MRc2,MRc4 is substantially parallel to the Y direction. In the sealing portion MR, the side surface MRc1 and the side surface MRc3 are located opposite to each other, the side surface MRc2 and the side surface MRc4 are located opposite to each other, the side surface MRc1 intersects the side surface MRc2,MRc4, and the side surface MRc3 intersects the side surface MRc2,MRc4. Each of upper surface MRa and the lower surface MRb is a plane parallel to both the X direction and the Y direction. The planar shape of the sealing portion MR, that is, the planar shape of upper surface MRa and the lower surface MRb of the sealing portion MR is, for example, a rectangular shape. The sealing portion MR has a side surface MR of the sealing portion MRc1 and the side surface MRc2 intersect with each other, a corner portion KD1 at which the side surface MRc4 and the side surface KD3 intersect with each other, a corner portion KD3 at which the side surface MRc3 and the side surface MR of the sealing portion MR intersect with each other, and a corner portion MRc3 at which the side surface MRc4 and the side surface MRc2 of the sealing portion MR intersect with each other.

Each of the plurality of leads LD included in the semiconductor device PKG is partially sealed in the sealing portion MR, and other part thereof protrudes from the side surface of the sealing portion MR to the outside of the sealing portion. Hereinafter, a portion of the lead LD located in the sealing portion MR is referred to as an inner lead portion, and a portion of the lead LD located outside the sealing portion MR is referred to as an outer lead portion. A plating layer (not shown) such as a solder plating layer may be formed on the outer lead portion of the lead LD.

The semiconductor device PKG of the present embodiment is a structure in which a part of the lead LD (the outer lead portion) protrudes from the side surface of the sealing portion MR, and will be described below based on this structure, but the structure is not limited to this structure. For example, it is also possible to adopt (SON (Small Outline Nonleaded Package) type configuration in which each lead LD hardly protrudes from the side surface of the sealing portion MR and a part of each lead LD is exposed on the lower surface MRb of the sealing portion.

The plurality of leads LD of the semiconductor device PKG includes a plurality of lead LD disposed on the side surface MRc1 of the sealing portion MR, and a plurality of lead LD disposed on the side surface MRc3 of the sealing portion MR. In FIGS. 2 to 9, the lead LD is not disposed on the side surface MRc2,MRc4 of the sealing portion MR. Hereinafter, the lead LD disposed on the side surface MRc1 of the sealing portion MR is referred to as a lead LD1 with reference numeral LD1. Further, the lead LD disposed on the side surface MRc3 of the sealing portion MR is referred to as a lead LD2 with reference numeral LD2.

The outer lead portions protrude out of the sealing portion MR from the side surface MRc1 of the sealing portion MR in the plurality of leads LD. Further, the outer lead portions of the plurality of leads LD disposed on the side surface MRc3 of the sealing portion MR protrude out of the sealing portion MR from the side surface MRc3 of the sealing portion. The outer lead portions of the respective lead LD are bent so that the lower surface near the end portion of the outer lead portion is located on substantially the same plane as the lower surface MRb of the sealing portion MR. The outer lead portion of the lead LD functions as an external connecting terminal portion (external terminal) of the semiconductor device PKG.

A die pad DPL is a chip mounting portion on which two semiconductor chips CPC,CPL are mounted, and the die pad DPH is a chip mounting portion on which the semiconductor chip CPH is mounted. The die pad DPH and the die pad DPL are spaced apart from each other in the Y direction, and a part of the sealing portion MR is interposed between the die pad DPH and the die pad DPL. In the die pad DPH,DPL, the die pad DPH is disposed on a side closer to the side surface MR the sealing portion MRc1, and the die pad DPL is disposed on a side closer to the side surface MRc3 of the sealing portion MR. That is, in the Y-direction, the die pad DPL is disposed between the die pad MR and the side surface MRc1 of the sealing portion MR, and the die pad DPH is disposed between the die pad DPH and the side surface MRc3 of the sealing portion. The die pad DPH,DPL are sealed in the sealing portion MR and are not exposed from the sealing portion MR. That is, in upper surface MRa and the lower surface MRb of the sealing portion MR, the die pad DPH,DPL are not exposed.

The die pad DPH,DPL and the plurality of leads LD are made of an electrical conductor, and are preferably made of a metallic material such as copper (Cu) or a copper alloy. In addition, the die pad DPH,DPL and the plurality of leads LD are preferably formed of the same material (the same metallic material), so that it is easy to manufacture a lead frame LF to be described later in which the die pad DPH,DPL and the plurality of leads LD are connected, and thus it is easy to manufacture the semiconductor device PKG using the lead frame LF.

The die pad DPH has a upper surface DPHa which is a main surface on the side on which the semiconductor chip CPC,CPH is mounted, a lower surface (rear surface) DPHb which is a main surface on the side, and side surface opposite a DPHc1,DPHc2,DPHc3,DPHc4 which intersects upper surface DPHa and the lower surface DPHb. In the die pad DPH, the side DPHc1 is a side surface located on the side of the sealing portion MR on the side surface MRc1, the side DPHc2 is a side surface located on the side surface MRc4 of the sealing portion MR, the side surface DPHc3 is located on the side surface DPHc3 of the sealing portion MR, the side surface DPHc4 is a side surface located on the side surface DPHc3 of the sealing portion MR. In the die pad DPH, the side DPHc1 and the side DPHc3 are located opposite to each other, the side DPHc2 and the side DPHc4 are located opposite to each other, the side DPHc1 intersects the side DPHc2,DPHc4, and the side DPHc3 intersects the side DPHc2,DPHc4.

Further, the die pad DPL has a upper surface DPLa which is a main surface on the side on which the semiconductor chip CPL is mounted, a lower surface (rear surface) DPLb which is a main surface on the opposite side, and a side surface DPLc1,DPLC2,DPLc3,DPLc4 which intersects upper surface DPLa and the lower surface DPLb. In the die pad DPL, the side DPLc1 is a side surface located on the side of the sealing portion MR on the side surface MRc1, the side DPLc2 is a side surface located on the side surface MRc4 of the sealing portion MR, the side surface DPLc3 is located on the side surface DPLc3 of the sealing portion MR, the side surface DPLc4 is a side surface located on the side surface DPLc3 of the sealing portion MR. In the die pad DPL, the side DPLc1 and the side DPLc3 are located opposite to each other, the side DPLc2 and the side DPLc4 are located opposite to each other, the side DPLc1 intersects the side DPLc2,DPLc4, and the side DPLc3 intersects the side DPLC2,DPLc4. The side surface DPHc3 of the die pad DPH and the side surface DPLc1 of the die pad DPL face each other via a part of the sealing portion MR.

The side DPH of the die pad DPHc1,DPHc3 and the side DPL of the die pad DPLc1,DPLc3 are substantially parallel to the X direction, and the side DPHc2,DPHc4 of the die pad DPL and the side DPLc2,DPLc4 of the die pad are substantially parallel to the Y direction. Each of upper surface DPHa and lower surface DPHb of the die pad DPH and upper surface DPLa and lower surface DPLb of the die pad DPL is a plane substantially parallel to both the X direction and the Y direction. Each planar shape of the die pad DPH,DPL is, for example, a rectangular shape.

Among the plurality of leads LD disposed on the side surface MRc1 of the sealing portion MR, the inner lead portion of the lead LD1a is integrally connected to the side surface DPHc2 of the die pad DPH, and the inner lead portion of the lead LD1b is integrally connected to the side surface DPHc4 of the die pad DPH. The lead LD1a,LD1b functions as a suspension lead that supports the die pad DPH to the frame of the lead frame during the manufacture of the semiconductor device PKG. Further, among the plurality of lead LD disposed on the side surface MRc3 of the sealing portion MR, the inner lead portion of the lead LD2a is integrally connected to the side surface DPLc2 of the die pad DPL, and the inner lead portion of the lead LD2b is integrally connected to the side surface DPLc4 of the die pad DPL. The lead LD2a,LD2b functions as a suspension lead that supports the die pad DPL to the frame of the lead frame during the manufacture of the semiconductor device PKG. On the side surface MRc1 of the sealing portion MR, the plurality of leads LD(LD1) are arranged in the X-direction, but in these arrangements, the lead LD1a and the lead LD1b are located at both ends. Further, a plurality of leads LD(LD2) are arranged in the X-direction on the side surface MRc3 of the sealing portion MR, but in these arrangements, the lead LD2a and the lead LD2b are positioned at both ends.

Each of the semiconductor chips CPC,CPH,CPL has a front surface, which is one main surface, and a back surface, which is an opposing main surface. The semiconductor chip CPH is mounted on upper surface DPHa of the die pad DPH with the back surface of the semiconductor chip CPH facing the die pad DPH via a bonding material BDH. The semiconductor chip CPC is mounted on upper surface DPLa of the die pad DPL with the back surface of the semiconductor chip CPC facing the die pad DPL via a bonding material BDC. The semiconductor chip CPL is mounted on upper surface DPLa of the die pad DPL with the back surface of the semiconductor chip CPL facing the die pad DPL via a bonding material BDL. That is, in the semiconductor chip CPC,CPH,CPL, the semiconductor chip CPH is mounted on the die pad DPH, and the semiconductor chip CPC,CPL is mounted on the die pad DPL.

In upper surface DPLa of the die pad DPL, the region on which the semiconductor chip CPC is mounted and the region on which the semiconductor chip CPL is mounted are separated from each other (specifically, separated in the X-direction). That is, the semiconductor chip CPC and the semiconductor chip CPL are not stacked on each other, but are arranged on upper surface DPLa of the die pad DPL so as to be spaced apart from each other in the X-direction. That is, the semiconductor chip CPC and the semiconductor chip CPL disposed on upper surface DPLa of the die pad DPL are adjacent to each other in the X-direction.

In plan view, the die pad DPL and the die pad DPH are adjacent to each other in the Y-direction. Therefore, in a plan view, the semiconductor chip CPL and the semiconductor chip CPH are adjacent to each other in the Y-direction. In a plan view, the semiconductor chip CPC and the semiconductor chip CPH are adjacent to each other in the Y-direction. In a plan view, the semiconductor chip CPC and the semiconductor chip CPL are included in upper surface DPLa of the die pad DPL. In a plan view, the semiconductor chip CPH is included in upper surface DPHa of the die pad DPH. The planar shape of each of the semiconductor chip CPC, CPH,CPL is, for example, a rectangular shape. A rectangular shape composing the planar shape of the semiconductor chip CPC,CPH,CPL has two sides substantially parallel to the X direction and two sides substantially parallel to the Y direction.

As the bonding material BDC,BDH,BDL, a conductive bonding material such as silver-paste can be used. The back surface of the semiconductor chip CPH is bonded and fixed to the die pad DPH via the junction material BDH, the back surface of the semiconductor chip CPC is bonded and fixed to the die pad DPH via the bonding material BDC, and the back surface of the semiconductor chip CPL is bonded and fixed to the die pad DPL via the bonding material BDL. The semiconductor chip CPC,CPH,CPL is sealed in the sealing portion MR and is not exposed from the sealing portion MR.

An insulating junction material can also be used as the bonding material BDC,BDH,BDL. However, when a conductive bonding material is used as the bonding material BDC,BDH,BDL, the heat generated in the semiconductor chip CPC,CPH,CPL can be easily conducted to the die pad DPH,DPL through the bonding material BDC,BDH,BDL.

A plurality of pads PH1,PH2,PH3,PH4 are formed on the semiconductor chip CPH. A plurality of pads PL1,PL2,PL3, PL4 are formed on the semiconductor chip CPL. A plurality of pads PC1,PC2,PC3,PC4,PC5,PC6 are formed on the semiconductor chip CPC. Note that the "bonding pad", "bonding pad electrode", "pad electrode", or "electrode" is simply referred to as "pad".

The respective pads CPL of the semiconductor chip PL1,PL2,PL3,PL4 are electrically connected to circuits (the above-mentioned transmitting circuit TX1, the receiving circuit RX2, the receiving circuit RX3, and the like) formed in the semiconductor chip CPL through the inner wires of the semiconductor chip.

Here, the pad PL1 of the semiconductor chip CPL is a pad electrically connected to the pad PC1 of the semiconductor chip CPC via the wire BW. The pad CPL of the semiconductor chip PL1 is electrically connected to the transmitting circuit TX1 in the semiconductor chip CPL through an inner wire of the semiconductor chip CPL. The pad PL2 of the semiconductor chip CPL is a pad electrically connected to the pad PC2 of the semiconductor chip CPC via the wire BW. The pad PL2 of the semiconductor chip CPL is electrically connected to the receiving circuit RX2 in the semiconductor chip CPL through an inner wire of the semiconductor chip CPL. The pad PL3 of the semiconductor chip CPL is a pad electrically connected to the pad PC3 of the semiconductor chip CPC via the wire BW. The pad PL3 of the semiconductor chip CPL is electrically connected to The receiving circuit RX3 in the semiconductor chip CPL through an inner wire of the semiconductor chip CPL. The pad PL4 of the semiconductor chip CPL is a pad electrically connected to the lead LD2 via the wire BW.

The respective pads PH1,PH2,PH3,PH4 of the semiconductor chip CPH are electrically connected to circuits (the receiving circuit RX1, the transmitting circuit TX2, the transmitting circuit TX3, the drive circuit DR, and the like) formed in the semiconductor chip CPH through the inner wires of the semiconductor chip CPH.

Here, the pad PH1 of the semiconductor chip CPH is a pad electrically connected to the pad PC4 of the semiconductor chip CPC via the wire BW. The pad PH1 of the semiconductor chip CPH is electrically connected to the receiving circuit RX1 in the semiconductor chip CPH through an inner wire of the semiconductor chip CPH. The pad PH2 of the semiconductor chip CPH is a pad electrically connected to the pad PC5 of the semiconductor chip CPC via the wire BW. The pad CPH of the semiconductor chip PH2 is electrically connected to the transmitting circuit TX2 in the semiconductor chip CPH through an inner wire of the semiconductor chip CPH. The pad PH3 of the semiconductor chip CPH is a pad electrically connected to the pad PC6 of the semiconductor chip CPC via the wire BW. The pad CPH of the semiconductor chip PH3 is electrically connected to the transmitting circuit TX3 in the semiconductor chip CPH through an inner wire of the semiconductor chip CPH. The pad PH4 of the semiconductor chip CPH is a pad electrically connected to the lead LD1 via the wire BW.

The pad CPC of the semiconductor chip PC1 is a pad electrically connected to the coiled L1a formed in the semiconductor chip CPC. The pad PC2 of the semiconductor chip CPC is a pad electrically connected to the coiled L2a formed in the semiconductor chip CPC. The pad PC3 of the semiconductor chip CPC is a pad electrically connected to the coiled L3a formed in the semiconductor chip CPC. The pad PC4 of the semiconductor chip CPC is a pad electrically connected to the coiled L1b formed in the semiconductor chip CPC. The pad PC5 of the semiconductor chip CPC is a pad electrically connected to the coiled L2b formed in the semiconductor chip CPC. The pad PC6 of the semiconductor chip CPC is a pad electrically connected to the coiled L3b formed in the semiconductor chip CPC.

The plurality of (two in this case) pads PL1 of the semiconductor chip CPL and the plurality of (two in this case) pads PC1 of the semiconductor chip CPC are electrically connected to each other via the wire BW. That is, one end of the wire BW is connected to each of the pad PL1 of the semiconductor chip CPL, and the other end of the wire BW is connected to the pad PC1 of the semiconductor chip CPC. In addition, the plurality of (two in this case) pads PL2 of the semiconductor chip CPL and the plurality of (two in this case) pads PC2 of the semiconductor chip CPC are electrically connected to each other via the wire BW. That is, one end of the wire BW is connected to each of the pad PL2 of the semiconductor chip CPL, and the other end of the wire BW is connected to the pad PC2 of the semiconductor chip CPC. In addition, the plurality of (two in this case) pads PL3 of the semiconductor chip CPL and the plurality of (two in this case) pads PC3 of the semiconductor chip CPC are electrically connected to each other via the wire BW. That is, one end of the wire BW is connected to each of the pad PL3 of the semiconductor chip CPL, and the other end of the wire BW is connected to the pad PC3 of the semiconductor chip CPC.

The plurality of (two in this case) pads PH1 of the semiconductor chip CPH and the plurality of (two in this case) pads PC4 of the semiconductor chip CPC are electrically connected to each other via the wire BW. That is, one end of the wire BW is connected to each of the pad PH1 of the semiconductor chip CPH, and the other end of the wire BW is connected to the pad PC4 of the semiconductor chip CPC. In addition, the plurality of (two in this case) pads PH2 of the semiconductor chip CPH and the plurality of (two in this case) pads PC5 of the semiconductor chip CPC are electrically connected to each other via the wire BW. That is, one end of the wire BW is connected to each of the pad PH2 of the semiconductor chip CPH, and the other end of the wire BW is connected to the pad PC5 of the semiconductor chip CPC. In addition, the plurality of (two in this case) pads PH3 of the semiconductor chip CPH and the plurality of (two in this case) pads PC6 of the semiconductor chip CPC are electrically connected to each other via the wire BW. That is, one end of the wire BW is connected to each of the pad PH3 of the semiconductor chip CPH, and the other end of the wire BW is connected to the pad PC6 of the semiconductor chip CPC.

Further, the plurality of pads PL4 of the semiconductor chip CPL and the plurality of leads LD2 are electrically connected to each other via the wire BW. That is, one end of the wire BW is connected to each of the pad PL4 of the semiconductor chip CPL, and the other end of the wire BW is connected to the inner lead portion of the lead LD2.

Further, the plurality of pads PH4 of the semiconductor chip CPH and the plurality of leads LD1 are electrically connected to each other via the wire BW. That is, one end of the wire BW is connected to each of the pad PH4 of the semiconductor chip CPH, and the other end of the wire BW is connected to the inner lead portion of the lead LD1.

The wire (bonding wire) BW is a conductive wire. The wire BW is specifically made of a metallic material, but a gold (Au) wire, a copper (Cu) wire, an aluminum (Al) wire, or the like can be suitably used. The wire BW is sealed in the sealing portion MR and is not exposed from the sealing portion MR. In the respective lead LD, the connecting portion of the wire BW is an inner lead portion located in the sealing portion MR.

When the semiconductor device PKG is used, the semiconductor chip the semiconductor device PKG in CPL is electrically connected to a circuit (specifically, the control circuit CC described above) outside the semiconductor device PKG via the wire BW (specifically, the wire BW electrically connecting the pad PL4 and the lead LD2) and a lead LD2. When the semiconductor device PKG is used, the semiconductor chip the semiconductor device PKG in CPH is electrically connected to a circuit (specifically, an inverter circuit including a power transistor TS1,TS2) outside the semiconductor device PKG via the wire BW (specifically, the wire BW electrically connecting the pad PH4 and the lead LD1) and a lead LD1. The semiconductor chip CPH includes the drive circuit DR that is electrically connected to the receiving circuit RX1, the transmitting circuit TX2, and the transmitting circuit TX3 that are formed in the semiconductor chip CPH via an inner wire of the semiconductor chip. When the semiconductor device PKG is used, the drive circuit CPH is electrically connected to a circuit (specifically, an inverter circuit including a power transistor TS1,TS2) outside the semiconductor device PKG via the wire BW (specifically, the wire BW electrically connecting the pad PH4 and the lead LD1) and a lead LD1. The power supply potential V1 supplied to the inverter circuit including the power transistor TS1,TS2 is higher than the power supply potential V2 supplied to the control circuit CC.

<Method of Manufacturing the Semiconductor Device>

Figure 14:
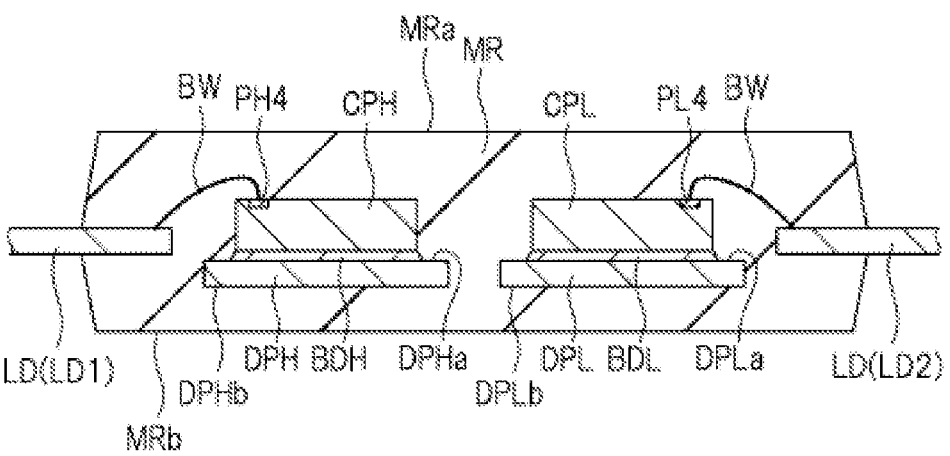
FIG. 14 is a cross-sectional view during the manufacturing process of the semiconductor device which is the same as FIG. 13.
Figure 15:
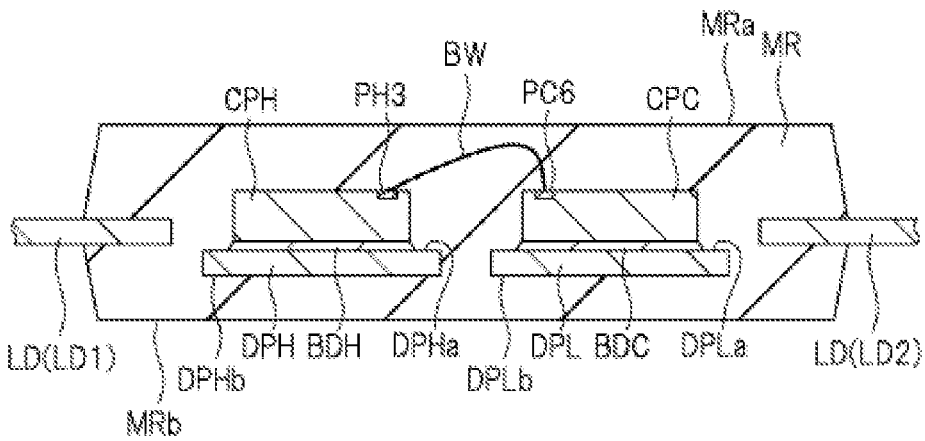
FIG. 15 is a cross-sectional view during the manufacturing process of the semiconductor device which is the same as FIG. 13.

Next, the manufacturing process (assembly process) of the semiconductor device PKG according to the present embodiment will be described referring to FIGS. 10 to 15. FIG. 10 to FIG. 15 are a plan view or a cross-sectional view during the manufacturing process of the semiconductor device PKG according to the present embodiment. Of these, FIGS. 10 to 13 are a plan view, FIG. 14 is a cross-sectional view corresponding to FIG. 7, and FIG. 15 is a cross-sectional view corresponding to FIG. 8.

In order to manufacture the semiconductor device PKG, a lead frame LF is prepared, and the semiconductor chip CPC,CPH,CPL is prepared. One of the lead frame LF and the semiconductor chip CPC,CPH,CPL may be prepared first before the other, or may be prepared at the same time.

Figure 10:
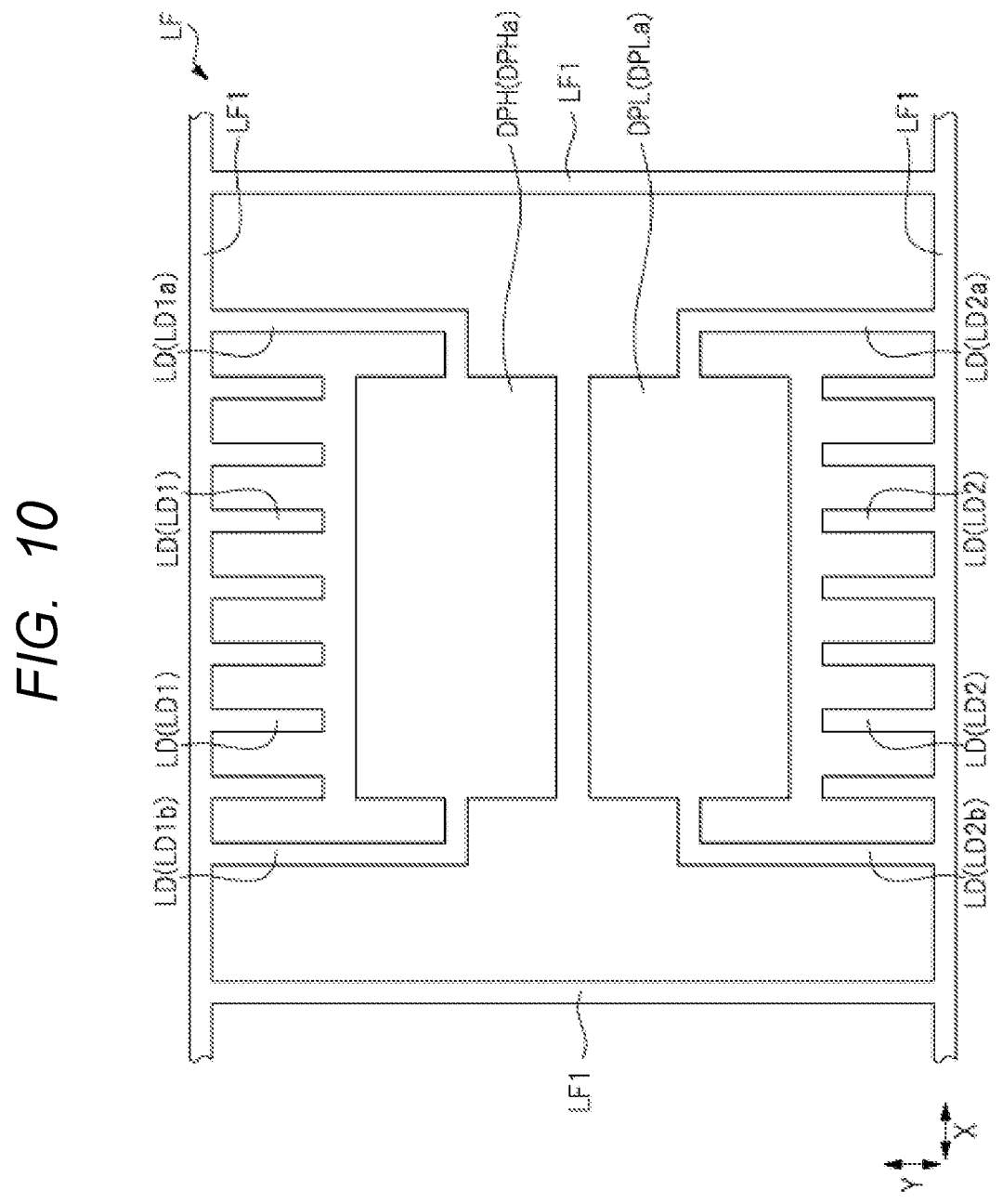

As shown in FIG. 10, the lead frame LF integrally includes a frame frame LF1, the die pad DPH,DPL, and a plurality of leads LD. The lead frame LF is made of, for example, a metallic material containing copper (Cu) as a main component, and is specifically made of copper (Cu) or copper (Cu) alloy. FIG. 10 shows an area of the lead frame LF from which one the semiconductor device PKG is manufactured. One end of each lead LD is integrally connected to the frame frame LF1. The die pad DPH is connected to the frame frame LF1 via a lead LD1a,LD1b, and the die pad DPL is connected to the frame frame LF1 via a lead LD2a,LD2b.

Figure 11:
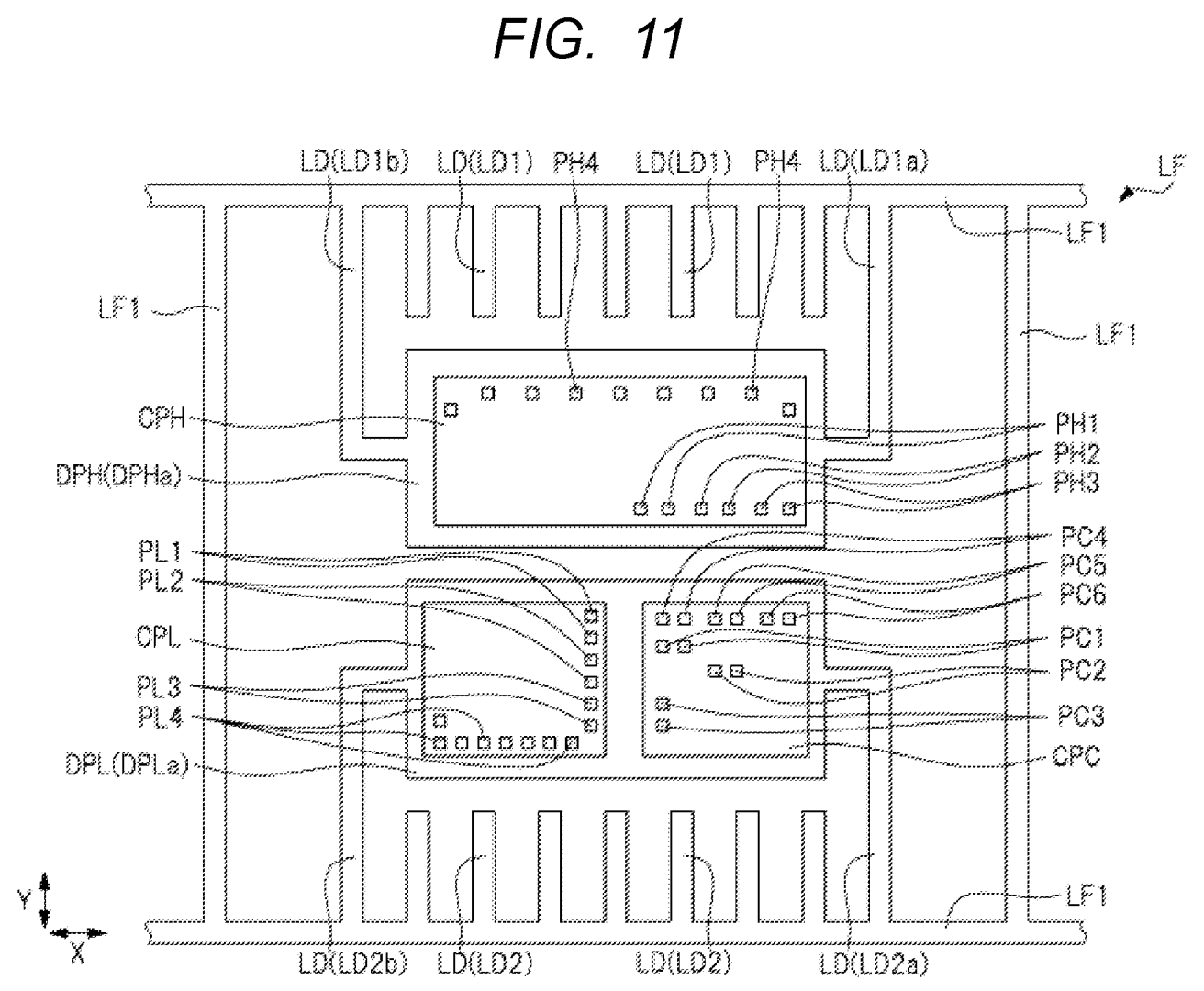

Next, as shown in FIG. 11, a semiconductor chip LF on DPH of the die pad upper surface DPHa via the bonding material BDH (see FIGS. 14 and 15) the semiconductor chip CPH is mounted on upper surface DPHa of the die pad DPL, the semiconductor chip CPC is mounted on upper surface DPLa of the die pad DPL via the bonding material BDC (see FIG. 15), mounting a semiconductor chip BDH via a bonding material upper surface DPHa (see FIG. 14) on the die pad CPC. At this time, each of the semiconductor chip CPC,CPH,CPL is mounted with its back surface facing the die pad. Thereafter, the bonding material BDC,BDH,BDL is cured by heat treatment or the like.

Figure 12:
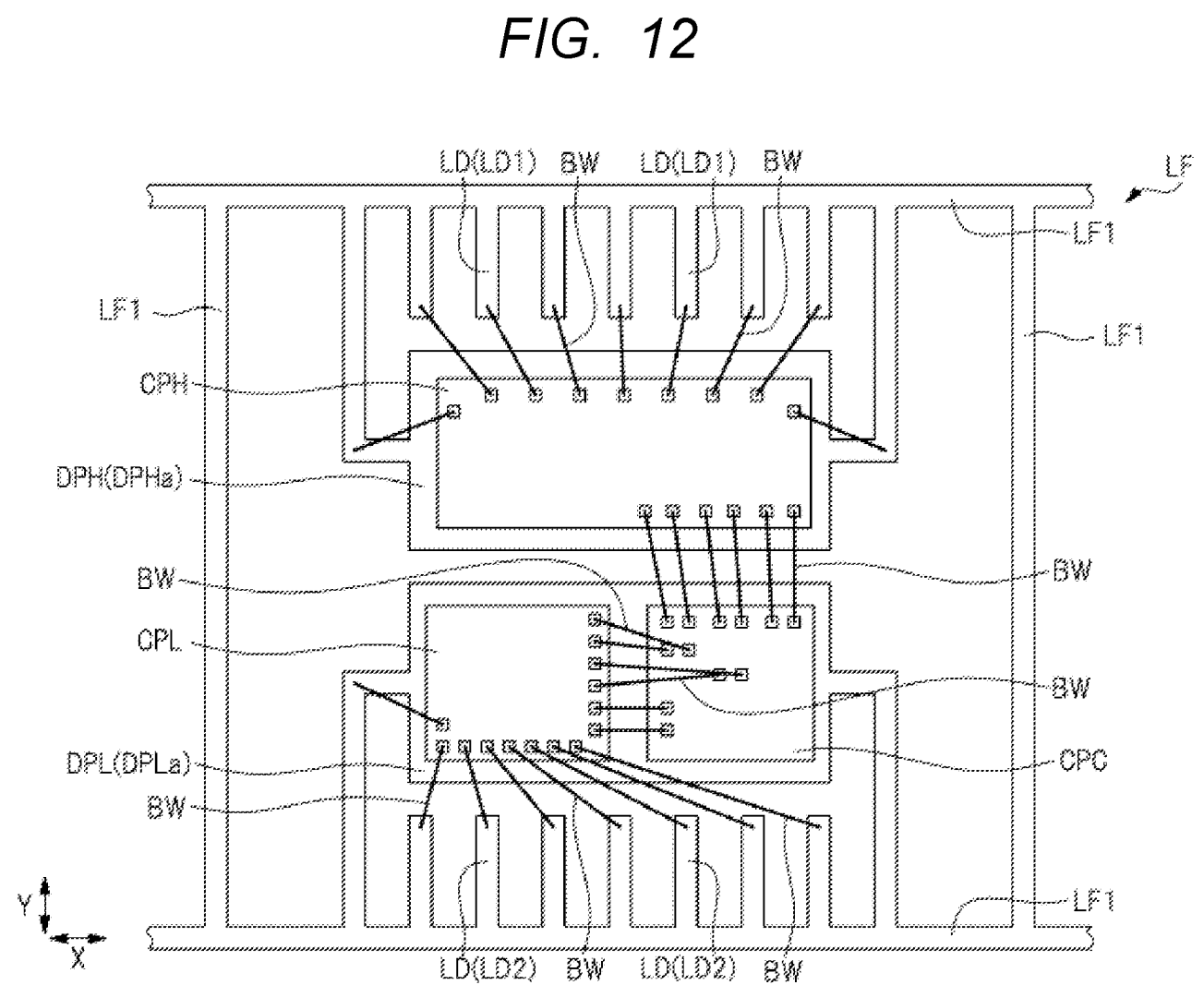

Next, as shown in FIG. 12, a wire bonding step is performed. In the wire bonding step, the pad CPL of the semiconductor chip PL3 and the pad PC1 of the semiconductor chip CPC, the pad PL2 of the semiconductor chip CPL and the pad PC2 of the semiconductor chip CPC, and the pad PC3 of the semiconductor chip PL1 of the semiconductor chip CPL are electrically connected to each other via the wire BW. Further, the pad CPH of the semiconductor chip PH3 and the pad PC4 of the semiconductor chip CPC, the pad PH2 of the semiconductor chip CPH and the pad PC5 of the semiconductor chip CPC, and the pad PC6 of the semiconductor chip PH1 of the semiconductor chip CPH are electrically connected to each other via the wire BW. Further, the pad PH4 and the lead LD1 of the semiconductor chip CPH and the pad PL4 and the lead LD2 of the semiconductor chip CPL are electrically connected to each other via the wire BW.

Figure 13:
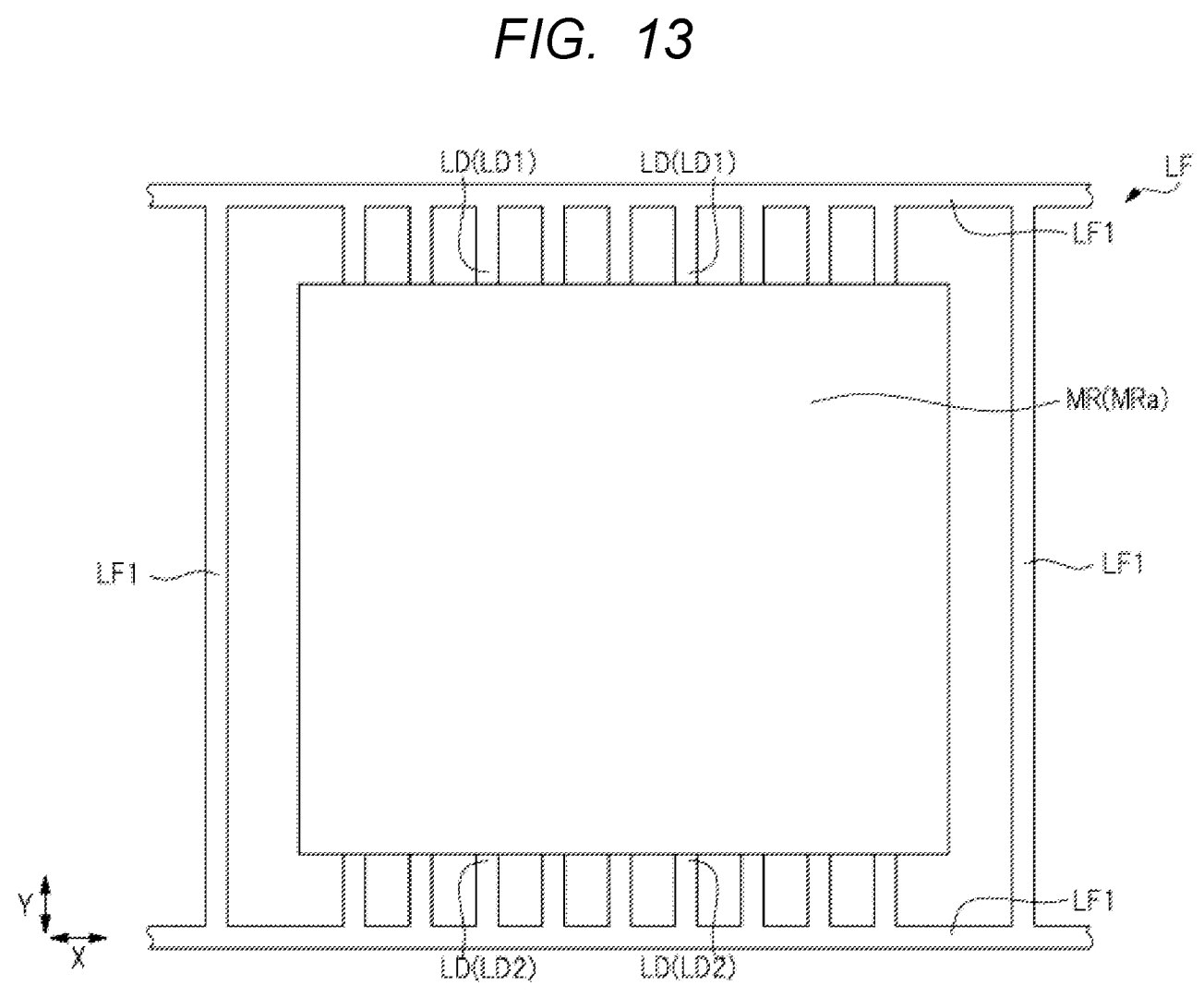

Next, resin sealing by the molding step (resin-molding step) is performed to form a sealing portion MR that seals the die pad DPH,DPL, the semiconductor chip CPC,CPH, CPL, the plurality of wires BW, and the inner lead portions of the plurality of leads LD, as shown in FIGS. 13 to 15.

Next, a plating layer (not shown) in formed on the outer lead portion of the lead LD exposed from the sealing portion MR as needed. Then, outside the sealing portion MR, the lead LD is cut at a predetermined position and separated from the frame LF1 of the lead frame LF.

Next, the outer lead portion of the lead LD protruding from the sealing portion MR is bent (lead process, lead forming).

In this way, the semiconductor device PKG shown in FIGS. 2 to 9 are manufactured.

<Semiconductor Chip>

Figure 16:
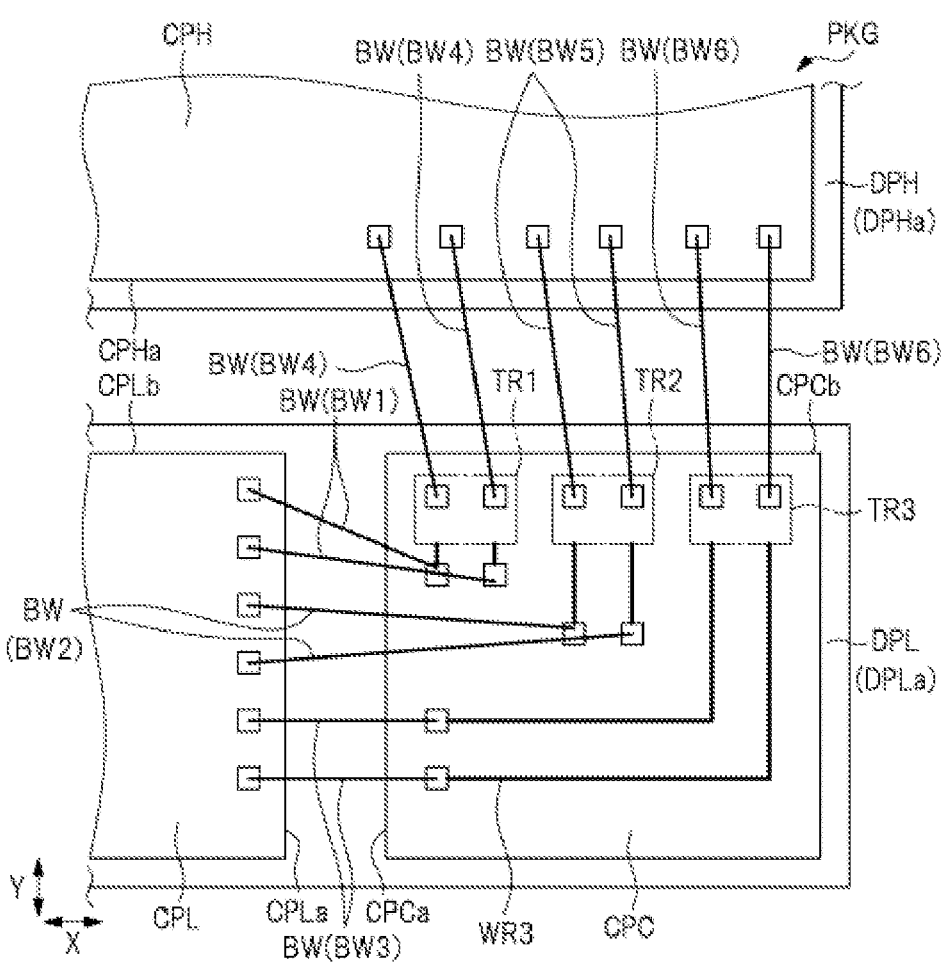
FIG. 16 is an enlarged perspective plan view of a portion of the semiconductor device according to the embodiment.
Figure 17:
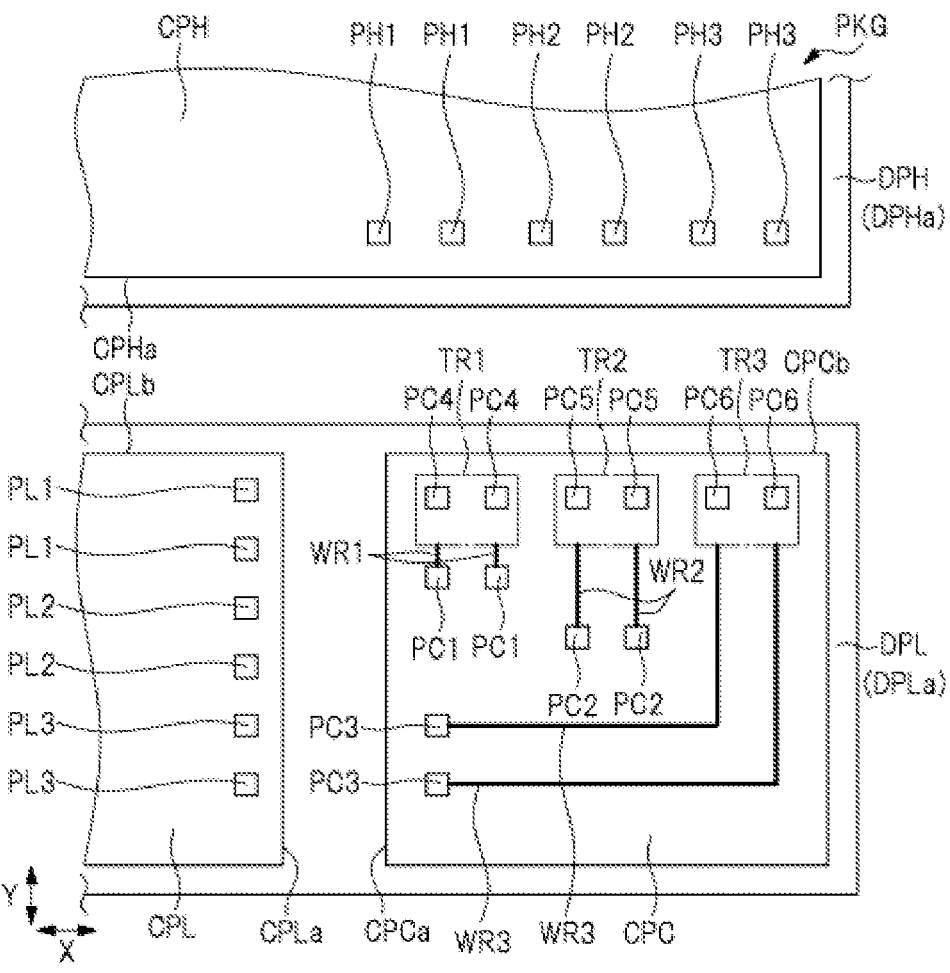
FIG. 17 is an enlarged perspective plan view of a portion of the semiconductor device according to the embodiment.

FIG. 16 and FIG. 17 are an enlarged perspective plan view of a portion of the semiconductor device PKG shown in FIG. 3. FIG. 16 shows a portion of each of the semiconductor chip CPC, the semiconductor chip CPH and the semiconductor chip CPL in the semiconductor device PKG when the sealing portion MR is seen through. FIG. 17 shows a portion of each of the semiconductor chip CPC, the semiconductor chip CPH and the semiconductor chip CPL in the semiconductor device PKG when the wire BW is further seen through (omitted) in FIG. 16.

Figure 18:
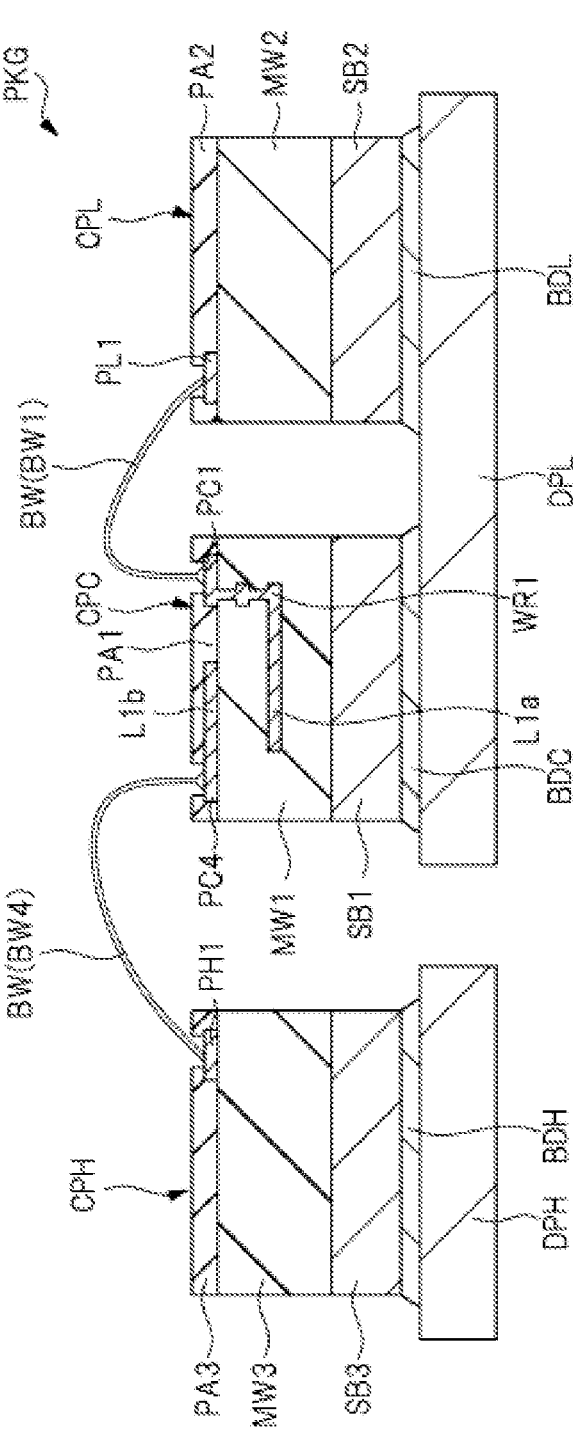
FIG. 18 is a cross-sectional view schematically showing a semiconductor chip in the semiconductor device according to the embodiment.
Figure 19:
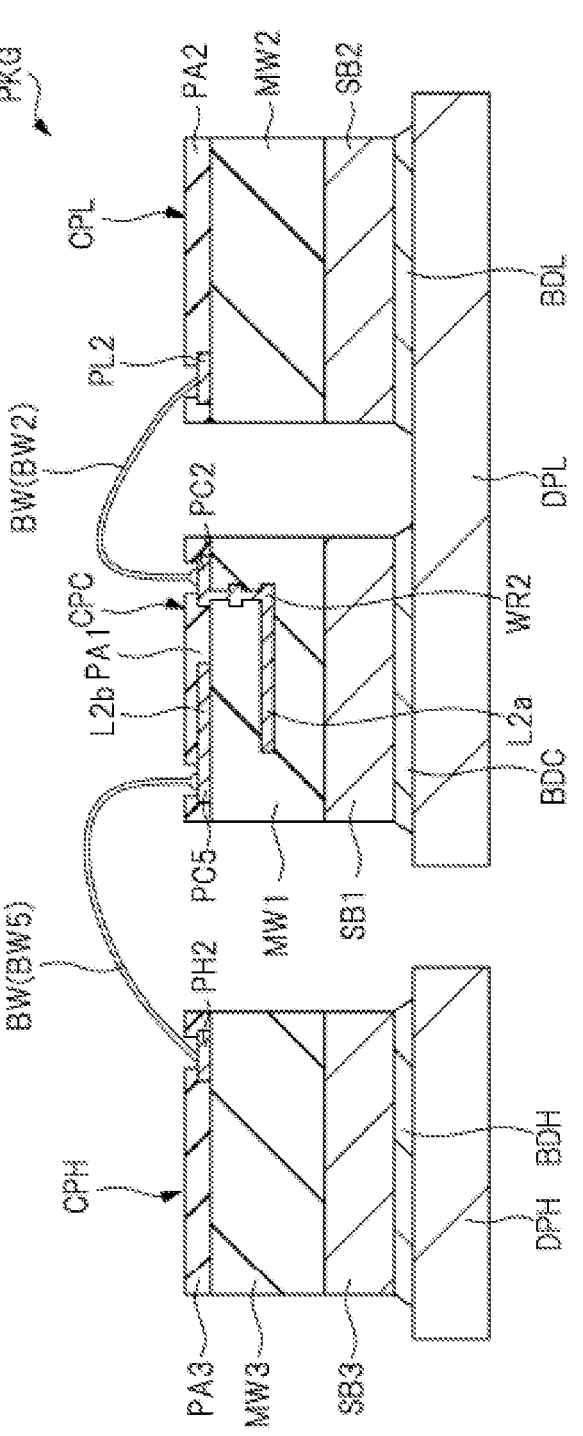
FIG. 19 is a cross-sectional view schematically showing a semiconductor chip in the semiconductor device according to the embodiment.
Figure 20:
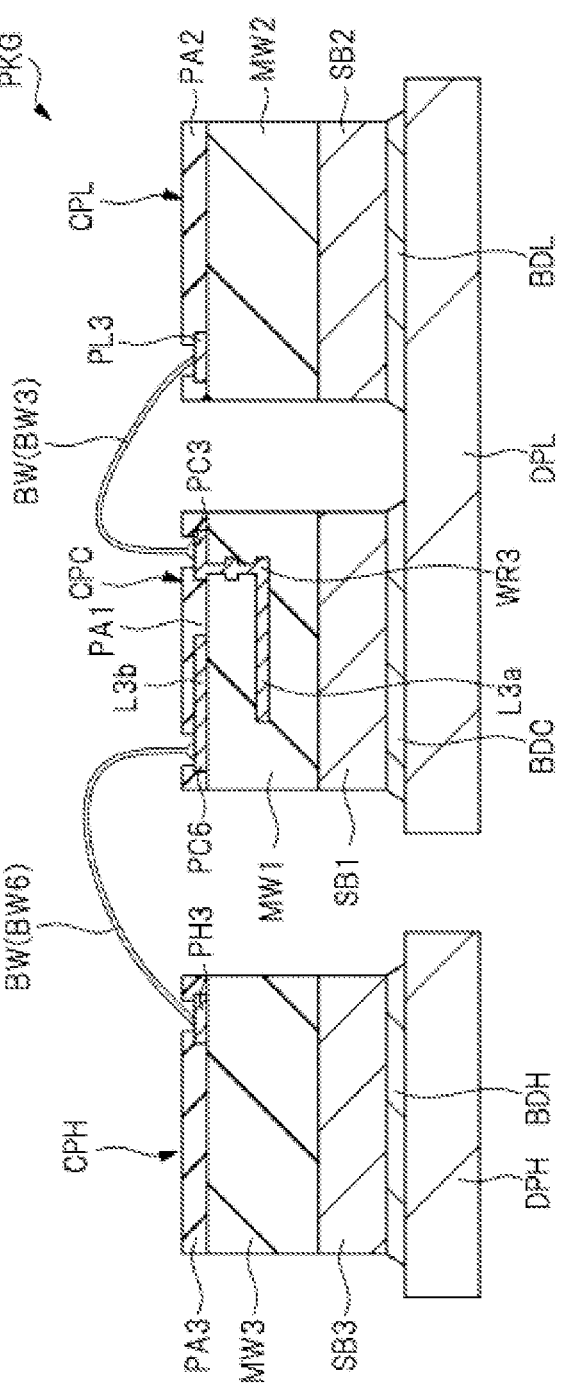
FIG. 20 is a cross-sectional view schematically showing a semiconductor chip in the semiconductor device according to the embodiment.

FIG. 18 to FIG. 20 are a cross-sectional view schematically showing the semiconductor chip CPC,CPH,CPL in the semiconductor device PKG. FIG. 18 corresponds to a cross-sectional view passing through the pads PL1,PC1,PC4,PH1 in FIG. 16. FIG. 19 corresponds to a cross-sectional view passing through the pads PL2,PC2,PC5,PH2 in FIG. 17. FIG. 20 corresponds to a cross-sectional view passing through the pads PL3,PC3,PC6,PH3 in FIG. 16. In FIG. 18 to FIG. 20, each die pad DPH,DPL, each semiconductor chip CPC,CPH,CPL, and each wire BW are shown, but the sealing portion MR is not shown.

As shown in FIGS. 18 to 20, the semiconductor chip CPC includes a semiconductor substrate SB1, a multi-layer wiring structure MW1 formed thereon, and a protective film PA1 formed thereon. The multi-layer wiring structure MW1 includes a plurality of interlayer insulating films and a plurality of interconnect layers. The protective film PA1 is a protective film located at the uppermost layer of the semiconductor chip CPC.

The semiconductor chip CPC also includes a coil L1$a$, L1$b$,L2$a$,L2$b$,L3$a$,L3$b$, and the coil L1$a$,L1$b$,L2$a$,L2$b$,L3$a$, L3$b$ is formed of wiring layers composing the multi-layer wiring structure MW1. The coil L1$a$,L1$b$ is shown in FIG. 18, the coil L2$a$,L2$b$ is shown in FIG. 19, and the coil L3$a$,L3$b$ is shown in FIG. 20. In FIG. 16 and FIG. 17, positions (formation regions) of the transformers TR1,TR2, TR3 in the semiconductor chip CPC are indicated by dashed-dotted lines. In FIG. 16 and FIG. 17, a coil L1$a$,L1$b$ composing a transformer TR1 is formed at a position (region) shown as a transformer TR1, a coil L2$a$,L2$b$ composing a transformer TR2 is formed at a position (region) shown as a transformer TR2, and a coil L3$a$,L3$b$ composing a transformer TR3 is formed at a position (region) shown as a transformer TR3. In addition, FIG. 16 and FIG. 17 schematically show the wiring WR1,WR2,WE3 in the semiconductor chip CPC in a perspective manner.

Among the coil L1$a$,L1$b$ composing the transformer TR1, the coil L1$a$ is electrically connected to the pad CPC of the semiconductor chip PC1 via the pad PH1 and the wire BW of the semiconductor chip CPH, and the coil L1$b$ is electrically connected to the pad L1$b$ of the semiconductor chip CPL via the pad PC4 and the wire BW of the semiconductor chip CPL (refer to FIG. 18). Further, among the coil L2$a$, L2$b$ composing the transformer TR2, the coil L2$a$ is electrically connected to the pad CPC of the semiconductor chip PC2 via the pad PH2 and the wire BW of the semiconductor chip CPH, and the coil L2$b$ is electrically connected to the pad L2$b$ of the semiconductor chip CPL via the pad PC5 and the wire BW of the semiconductor chip CPL (see FIG. 19). Further, among the coil L3$a$,L3$b$ composing the transformer TR3, the coil L3$a$ is electrically connected to the pad CPC of the semiconductor chip PC3 via the pad PH3 and the wire BW of the semiconductor chip CPH, and the coil L3$b$ is electrically connected to the pad L3$b$ of the semiconductor chip CPL via the pad PC6 and the wire BW of the semiconductor chip CPL (refer to FIG. 20).

In the semiconductor chip CPC, the coil L1$a$ and the coil L1$b$ are formed at positions overlapping each other in a plan view, and the coil L1$a$ is formed below the coil L1$b$. Further, in the semiconductor chip CPC, the coil L2$a$ and the coil L2$b$ are formed at positions overlapping each other in a plan view, and the coil L2$a$ is formed below the coil L2$b$. Further, in the semiconductor chip CPC, the coil L3$a$ and the coil L3$b$ are formed at positions overlapping each other in a plan view, and the coil L3$a$ is formed below the coil L3$b$. In the semiconductor chip CPC, the coil L1$a$, the coil L2$a$, and the coil L3$a$ are preferably formed in the same layer, and the coil L1$b$, the coil L2$b$, and the coil L3$b$ are preferably formed in the same layer. Each of the coil L1$a$,L1$b$,L2$a$,L2$b$,L3$a$,L3$b$ is formed by a spiral conductive pattern (wiring pattern).

The coiled L1$b$,L2$b$,L3$b$ is preferably formed in the uppermost wiring layer among the plurality of wiring layers composing the multi-layer wiring structure MW1. In this case, a coiled L1$b$,L2$b$,L3$b$ is formed on the uppermost interlayer insulating film among the plurality of interlayer insulating films composing the multi-layer wiring structure MW1. The coil L1$b$,L2$b$,L3$b$ is covered with a protective film PA1, but pad PC1 are connected to both ends of the coil L1$b$, pad PC2 are connected to both ends of the coil L2$b$, and pad PC3 are connected to both ends of the coil L3$b$.

The coil L1$a$,L2$a$,L3$a$ is formed in a wiring layer lower than the wiring layer in which the coil L1$b$,L2$b$,L3$b$ is formed, among the plurality of wiring layers composing the multi-layer wiring structure MW1. Both ends of the coil L1$a$ are connected to the pad PC1 through wiring (for example, wiring WR1 in FIGS. 16 to 18) included in the multi-layer wiring structure MW1. In addition, both end portions of the coil L2$a$ are connected to the pad PC2 through the wiring (for example, the wiring WR2 in FIGS. 16, 17, and 19) included in the multi-layer wiring structure MW1. In addition, both end portions of the coil L3$a$ are connected to the pad PC3 through the wiring (for example, the wiring WR3 in FIGS. 16, 17, and 20) included in the multi-layer wiring structure MW1.

The pad PC1,PC2,PC3,PC4,PC5,PC6 of the semiconductor chip CPC is formed in the uppermost wiring layer among the plurality of wiring layers composing the multi-layer wiring structure MW1, and is exposed from the opening of the protective film PA1. Wire BW are respectively connected to the pad PC1,PC2,PC3,PC4,PC5,PC6 exposed from the opening of the protective film PA1.

The semiconductor device (that is, a transistor such as MOSFET described above) is not formed in the semiconductor chip CPC. That is, the semiconductor device (that is, a transistor such as MOSFET described above) is not formed in semiconductor substrate SB1 composing the semiconductor chip CPC.

The semiconductor chip CPH includes a semiconductor substrate SB2, a multi-layer wiring structure MW2 formed thereon, and a protective film PA2 formed thereon. The multi-layer wiring structure MW2 includes a plurality of interlayer insulating films and a plurality of interconnect layers. The protective film PA2 is a protective film located at the uppermost layer of the semiconductor chip CPH.

A plurality of semiconductor elements (not shown) such as transistors are formed in semiconductor substrate SB2 composing the semiconductor chip CPH. The pad PH1,PH2, PH3,PH4 of the semiconductor chip CPH is formed in the uppermost wiring layer among the plurality of wiring layers composing the multi-layer wiring structure MW2, and is exposed from the opening of the protective film PA2. The wire BW are respectively connected to the pad PH1,PH2, PH3,PH4 exposed from the opening of the protective film PA2.

The semiconductor chip CPL includes a semiconductor substrate SB3, a multi-layer wiring structure MW3 formed thereon, and a protective film PA3 formed thereon. The multi-layer wiring structure MW3 includes a plurality of interlayer insulating films and a plurality of interconnect layers. The protective film PA3 is a protective film located at the uppermost layer of the semiconductor chip CPL.

A plurality of semiconductor elements (not shown) such as transistors are formed in semiconductor substrate SB3 composing the semiconductor chip CPL. The pad PL1,PL2, PL3,PL4 of the semiconductor chip CPL is formed in the uppermost wiring layer among the plurality of wiring layers composing the multi-layer wiring structure MW3, and is exposed from the opening of the protective film PA3. Wire BW are respectively connected to the pad PL1,PL2,PL3,PL4 exposed from the opening of the protective film PA3.

Next, the positional relation between the die pad DPH, DPL in the semiconductor device PKG and the semiconductor chip CPC,CPL,CPH in a plan view will be described.

As can be seen from FIGS. 3 to 5, the die pad DPH and the die pad DPL are adjacent to each other in the Y-direction. That is, the die pad DPL is located next to the die pad DPH in the Y-direction. The semiconductor chip CPH is disposed on the die pad DPH, and the semiconductor chip CPC,CPL is disposed on the die pad DPL. As can be seen from FIGS. 3, 5, 16, and 17, the semiconductor chip CPC and the semiconductor chip CPL are adjacent to each other in the X-direction. That is, the semiconductor chip CPC is located next to the semiconductor chip CPL in the X-direction. Reflecting that the die pad DPH and the die pad DPL are adjacent to each other in the Y direction, the semiconductor chip CPL and the semiconductor chip CPH are adjacent to each other in the X direction, and the semiconductor chip CPC and the semiconductor chip CPH are adjacent to each other in the X direction.

In a plan view, the semiconductor chip CPC has a side CPCa facing the side CPLa of the semiconductor chip CPL and a side CPCb facing the side CPHa of the semiconductor chip CPH. That is, the side CPLa of the semiconductor chip CPL and the side CPCa of the semiconductor chip CPC face each other in the X direction, and the side CPCb of the semiconductor chip CPC and the side CPHa of the semiconductor chip CPH face each other in the Y direction. The side CPLb of the semiconductor chip CPL and the side CPHa of the semiconductor chip CPH face each other in the Y-direction. The side CPL of the semiconductor chip CPLb and the side CPLa of the semiconductor chip CPC are substantially parallel to the Y direction, and the side CPCa of the semiconductor chip CPH and the side CPHa of the semiconductor chip CPC and the side CPCb of the semiconductor chip CPL are substantially parallel to the X direction.

Here, in each of the semiconductor chip CPL,CPH, a pad electrically connected to a transmitting circuit in the semiconductor chip is referred to as a transmitting pad, and a pad electrically connected to a receiving circuit in the semiconductor chip is referred to as a receiving pad. The pad PL1 of the semiconductor chip CPL is a transmitting pad, the pad PL2 of the semiconductor chip CPL is a receiving pad, and the pad PL3 of the semiconductor chip CPL is a receiving pad. The pad PH1 of the semiconductor chip CPH is a receiving pad, the pad PH2 of the semiconductor chip CPH is a transmitting pad, and the pad PH3 of the semiconductor chip CPH is a transmitting pad. Therefore, in the following description, the pad PL1 may be referred to as a transmitting pad PL1, the pad PL2 may be referred to as a receiving pad PL2, the pad PL3 may be referred to as a receiving pad PL3, the pad PH1 may be referred to as a receiving pad PH1, the pad PH2 may be referred to as a transmitting pad PH2, and the pad PH3 may be referred to as a transmitting pad PH3.

Further, a transformer used for transmitting a signal transmitted by the semiconductor chip CPL to the semiconductor chip CPH is referred to as a transmitting transformer, and a transformer used for transmitting a signal transmitted by the semiconductor chip CPH to the semiconductor chip CPL is referred to as a reception transformer. In the present embodiment, the transformer CPC in the semiconductor chip TR1 may be referred to as a transmitting transformer TR1 in the following because it is used to transmit a signal transmitted by the semiconductor chip CPL to the semiconductor chip CPH. Further, in the present embodiment, the transformer TR2 and the transformer TR3 in the semiconductor chip used to transmit the signal transmitted by the semiconductor chip CPH to the semiconductor chip CPL and receive the signal at the semiconductor chip CPL, and therefore, in the following, they may be referred to as a receiving transformer TR2 and a receiving transformer TR3, respectively.

The primary coil of the transmitting transformer is electrically connected to the plurality of transmitting pads of the semiconductor chip CPL, and the secondary coil of the transmitting transformer is electrically connected to the plurality of receiving pads of the semiconductor chip CPH. The primary coil of the receiving transformer is electrically connected to the plurality of transmitting pads of the semiconductor chip CPH, and the secondary coil of the receiving transformer is electrically connected to the plurality of receiving pads of the semiconductor chip CPL.

The wire BW electrically connecting the pad PC1 of the semiconductor chip CPC with the pad PL1 of the semiconductor chip CPL is referred to as a wire BW1. The wire BW electrically connecting the pad PC2 of the semiconductor chip CPC with the pad PL2 of the semiconductor chip CPL is referred to as a wire BW2. The wire BW electrically connecting the pad PC3 of the semiconductor chip CPC with the pad PL3 of the semiconductor chip CPL is referred to as a wire BW3. The wire BW electrically connecting the pad PC4 of the semiconductor chip CPC with the pad PH1 of the semiconductor chip CPH is referred to as a wire BW4. The wire BW electrically connecting the pad PC5 of the semiconductor chip CPC with the pad PH2 of the semiconductor chip CPH is referred to as a wire BW5. The wire BW electrically connecting the pad PC6 of the semiconductor chip CPC with the pad PH3 of the semiconductor chip CPH is referred to as a wire BW6.

As can be seen from FIGS. 16 and 17, in the semiconductor chip CPC, the transformer TR1,TR2,TR3 is arranged along the side CPCb of the semiconductor chip in a plan view. The transformer TR1,TR2,TR3 do not overlap each other in plan view, and are separated from each other in plan view.

As can be seen from FIGS. 16 and 17, in the semiconductor chip CPC, the transmitting transformer TR1 is disposed closer to the semiconductor chip CPL than the receiving transformer TR2,TR3 in plan view. That is, the distance (interval) between the transmitting transformer TR1 and the semiconductor chip CPL in the X direction is smaller than the distance (interval) between the reception transformer TR2 and the semiconductor chip CPL in the X direction, and is smaller than the distance (interval) between the reception transformer TR3 and the semiconductor chip CPL in the X direction. In FIGS. 16 and 17, of the transformer TR1,TR2, TR3, the transmitting transformer TR1 is located closest to the semiconductor chip CPL, the reception transformer TR3 is located farthest from the semiconductor chip CPL, and the reception transformer TR2 is located between the transmitting transformer TR1 and the reception transformer TR3. In another aspect, in the semiconductor chip CPC, the position of the reception transformer TR2 and the position of the reception transformer TR3 may be interchanged, but even in such cases, the transmitting transformer TR1 of the transformer TR1,TR2,TR3 is located closest to the semiconductor chip CPL.

As can be seen from FIGS. 16 and 17, in the semiconductor chip CPC, the pads PC4,PC5,PC6 are arranged along the side CPCb of the semiconductor chip CPC in a plan view. In the semiconductor chip CPC, the pad PC4 is disposed closer to the semiconductor chip CPL than the pad PC5,PC6 in a plan view. That is, the distance between the pad PC4 and the semiconductor chip CPL in the X direction is smaller than the distance between the pad PC5 and the semiconductor chip CPL in the X direction and smaller than the distance between the pad PC6 and the semiconductor chip CPL in the X direction. In FIGS. 16 and 17, of the pad PC4,PC5,PC6, the pad PC4 is located closest to the semiconductor chip CPL, the pad PC6 is located farthest from the semiconductor chip CPL, and the pad PC5 is located between the pad PC4 and the pad PC6. As another aspect, in the semiconductor chip CPC, when the position of the reception transformer TR2 and the position of the reception transformer TR3 are switched, it is preferable that the position of the pad PC5 and the position of the pad PC6 be switched in the semiconductor chip CPC.

As can be seen from FIGS. 16 and 17, in the semiconductor chip CPL, the pads PL1,PL2,PL3 are arranged along the side CPLa of the semiconductor chip CPL in a plan view. In the semiconductor chip CPL, the transmitting pad PL1 is disposed closer to the semiconductor chip CPH than the receiving pad PL2,PL3 in plan view. That is, the distance (interval) between the transmitting pad PL1 and the semiconductor chip CPH in the Y direction is smaller than the distance (interval) between the receiving pad PL2 and the semiconductor chip CPH in the Y direction and smaller than the distance (interval) between the receiving pad PL3 and the semiconductor chip CPH in the Y direction. In FIGS. 16 and 17, of the pad PL1,PL2,PL3, the transmitting pad PL1 is located closest to the semiconductor chip CPH, the receiving pad PL3 is located farthest from the semiconductor chip CPH, and the receiving pad PL2 is located between the transmitting pad PL1 and the receiving pad PL3. In another aspect, when the position of the receiving transformer TR2 and the position of the receiving transformer TR3 are interchanged in the semiconductor chip CPC, it is preferable that the position of the receiving pad PL2 and the position of the receiving pad PL3 are interchanged in the semiconductor chip CPL.

As can be seen from FIGS. 16 and 17, in the semiconductor chip CPH, the pads PH1,PH2,PH3 are arranged along the side CPHa of the semiconductor chip CPH in a plan view. In the semiconductor chip CPH, the receiving pad PH1 is disposed closer to the semiconductor chip CPL than the transmitting pad PH2,PH3 in a plan view. That is, in plan view, the distance (interval) between the receiving pad PH1 and the semiconductor chip CPL in the X direction is smaller than the distance (interval) between the transmitting pad PH2 and the semiconductor chip CPL in the X direction, and is smaller than the distance (interval) between the transmitting pad PH3 and the semiconductor chip CPL in the X direction. In FIGS. 16 and 17, of the pad PH1,PH2,PH3, the receiving pad PH1 is located closest to the semiconductor chip CPL, the transmitting pad PH3 is located farthest from the semiconductor chip CPL, and the transmitting pad PH2 is located between the receiving pad PH1 and the transmitting pad PH3. In another aspect, in the semiconductor chip CPC, when the position of the reception transformer TR2 and the position of the reception transformer TR3 are interchanged, it is preferable to interchange the position of the transmitting pad PH2 and the position of the transmitting pad PH3 in the semiconductor chip CPH.

<Background of Study>

Figure 21:
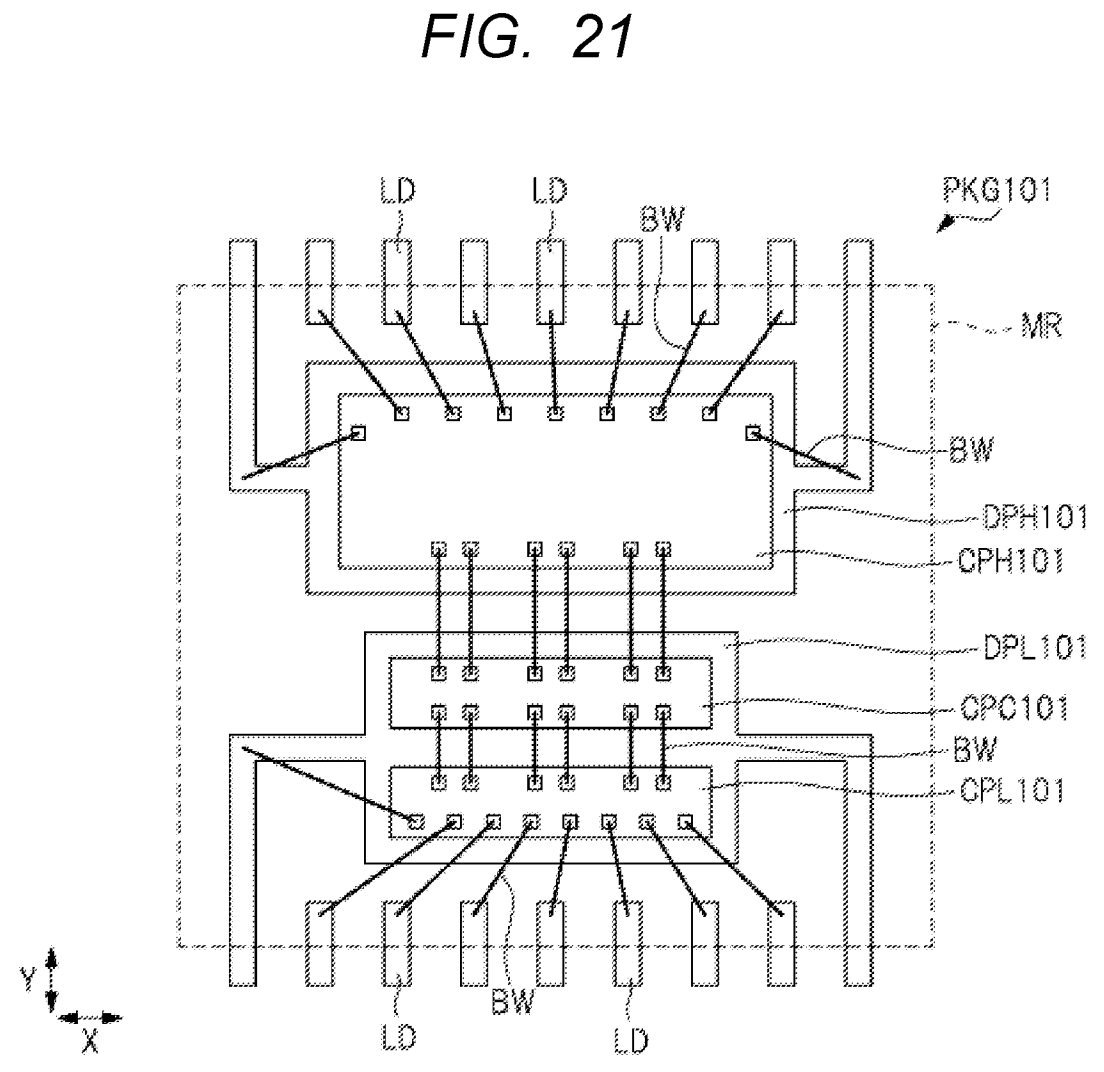

FIG. 21 is a perspective plan view of a semiconductor device PKG101 according to an examined example studied by the present inventor, and corresponds to FIG. 2.

The semiconductor device PKG101 according to the examined example shown in FIG. 21 has a die pad DPH101, DPL101 instead of the die pad DPH,DPL. A semiconductor chip CPH101 corresponding to the semiconductor chip CPH is mounted on the die pad DPH101. Also, a semiconductor chip CPL101 corresponding to the semiconductor chip CPL and a semiconductor chip CPC101 corresponding to the semiconductor chip CPC are mounted on the die pad DPL101.

In the semiconductor device PKG101 according to the examined example shown in FIG. 21, the three semiconductor chips CPL101,CPC101,CPH101 are arranged in the Y direction. In this case, it has been found through studies by the present inventors that the following problems may occur.

In recent years, with the enhancement of the functionality of the semiconductor device and an increase in the current flowing through a circuit (such as an inverter circuit) to be used, the planar dimension (planar area) of the semiconductor chip CPH,CPH101 for a high voltage tends to increase as compared with the planar dimension (planar area) of the semiconductor chip CPL,CPL101 for a low voltage.

Like the semiconductor device PKG101 according to the examined example shown in FIG. 21, the dimension of the semiconductor device PKG101 in the Y direction increases when the three semiconductor chips CPL101,CPC101, CPH101 are arranged in the Y direction. This leads to an increase in the size of the semiconductor device PKG101. In order to reduce the dimension of the semiconductor device PKG101 in the Y direction, it is effective to reduce the dimension of the respective semiconductor chip CPL101, CPC101,CPH101 in the Y direction. However, when the dimension of each semiconductor chip CPL101,CPC101, CPH101 in the Y direction is reduced, the dimension of each semiconductor chip CPL101,CPC101,CPH101 in the X direction is required to be increased accordingly, and thus the aspect ratio of each semiconductor chip CPL101, CPC101,CPH101 (the ratio of the dimension in the X direction to the dimension in the Y direction) is increased. When the aspect ratio of the semiconductor chip increases, cracks tend to occur in the semiconductor chip, for example, when the semiconductor wafer is cut to obtain a semiconductor chip, or when the semiconductor chip is conveyed. This lowers the manufacturing yield of the semiconductor chip and the manufacturing yield of the semiconductor device incorporating the semiconductor chip.

Further, since the planar dimensions of each of the semiconductor chip CPH101 are smaller than the planar dimensions of the semiconductor chip CPL101,CPC101, the aspect ratio of each of the semiconductor chip CPL101, CPC101 is considerably larger than the aspect ratio of the semiconductor chip CPH101 when the X-direction dimensions of each of the semiconductor chip CPL101,CPC101, CPH101 are made the same. Therefore, the aspect ratio is large semiconductor chip CPL101,CPC101, the cracking problem is of particular concern. In the semiconductor device PKG101, when the dimension of each of the semiconductor chip CPL101,CPC101 in the X direction is made smaller than the dimension of the semiconductor chip CPH101 in the X direction, the difference between the amount (volume) of the sealing resin located around the semiconductor chip CPH101 and the amount (volume) of the sealing resin located around the semiconductor chip CPL101 becomes large. Consequently, the flatness of the semiconductor device PKG101 may decrease (that is, the semiconductor device PKG101 may warp).

<Main Features and Effects>

One of the main features of the semiconductor device PKG of the present embodiment is that the semiconductor chip CPH is disposed on the die pad DPH, the semiconductor chip CPC,CPL is disposed on the die pad DPL located next to the die pad DPH in the Y direction, and the semiconductor chip CPC and the semiconductor chip CPL are adjacent to each other in the X direction perpendicular to the Y direction. This makes it possible to reduce the dimension of the semiconductor device PKG of the present embodiment in the Y direction without increasing the aspect ratio (the ratio of the dimension in the X direction to the dimension in the Y direction) of each of the semiconductor chip CPC,CPL. Therefore, it is possible to reduce the size of the semiconductor device. Further, since the aspect ratio of each of the semiconductor chip CPC,CPL can be suppressed, it is possible to suppress the risk of cracks occurring in the semiconductor chip CPL,CPC, for example, when a semiconductor chip is obtained by cutting a semiconductor wafer or when a semiconductor chip is conveyed. Therefore, the manufacturing yield of the semiconductor chip CPL,CPC and the manufacturing yield of the semiconductor device PKG can be improved. Further, in the semiconductor device PKG, since the semiconductor chip CPH,CPL,CPC can be arranged in a well-balanced manner in the sealing portion MR, it is possible to reduce the difference between the amount (volume) of the sealing resin located around the semiconductor chip CPH, the amount (volume) of the sealing resin located around the semiconductor chip CPL, and the amount (volume) of the sealing resin located around the semiconductor chip CPC. Consequently, warpage of the semiconductor device PKG can be suppressed or prevented, and flatness of the semiconductor device PKG can be improved.

When such the semiconductor chip CPL,CPC,CPH is laid out, it is not possible to achieve both the arrangement of a plurality of transformers (TR1,TR2,TR3) in the semiconductor chip CPC equidistant from the semiconductor chip CPL and the arrangement of a plurality of transformers (TR1,TR2,TR3) in the semiconductor chip CPH equidistant from the semiconductor chip OOF. For this reason, it has been found by studies conducted by the present inventors that it is crucial to improve the performance of the semiconductor device PKG to devise an arrangement position of a plurality of transformers (TR1,TR2,TR3) in the semiconductor chip CPC, an arrangement position of the pad PL1, PL2,PL3 in the semiconductor chip CPL, and an arrangement position of the pad PH1,PH2,PH3 in the semiconductor chip CPH.

That is, a signal is transmitted from the transmitting circuit to the primary coil of the transformer to cause a current to flow through the primary coil, and an induced current (or induced electromotive force) generated in the secondary coil of the transformer is detected (received) by the reception circuit in response to the current, whereby a signal can be transmitted from the transmitting circuit to the reception circuit via the transformer. Here, among the electric resistance of the conductive path from the transmitting circuit to the primary coil of the transformer and the electric resistance of the conductive path from the secondary coil of the transformer to the reception circuit, the electric resistance of the conductive path from the transmitting circuit to the transformer when transmitting a signal to the reception circuit via the transformer is easily affected is the electric resistance of the conductive path from the transmitting circuit to the primary coil of the transformer. That is, if the resistance loss from the transmitting circuit to the primary coil of the transformer is large, the induced current does not flow successfully to the secondary coil of the transformer, and as a result, it becomes impossible to accurately transmit a signal from the transmitting circuit to the reception circuit via the transformer. Therefore, when transmitting a signal from the transmitting circuit to the reception circuit via the transformer, in order to prevent the deterioration of the signal as much as possible, it is important to reduce the electrical resistance of the conductive path from the transmitting circuit to the primary coil of the transformer, to suppress the resistance loss from the transmitting circuit to the primary coil of the transformer. Compared to the importance of reducing the electrical resistance of the conductive path from the transmit circuit to the primary coil of the transformer, it is acceptable that the electrical resistance of the conductive path from the secondary coil of the transformer to the receive circuit be increased to some extent.

Therefore, in order to reduce the electrical resistance of the conductive path from the transmitting circuit to the primary coil of the transformer, the following contrivance is made.

The semiconductor device PKG of the present embodiment incorporates the semiconductor chip CPC,CPL,CPH, and the semiconductor chip CPC includes one or more transmitting transformers (in this case, a transformer TR1) and one or more receiving transformers (in this case, a transformer TR2,TR3). As described above, the transmitting transformer is used for transmitting a signal from the semiconductor chip CPL to the semiconductor chip CPH, and the receiving transformer is used for transmitting a signal from the semiconductor chip CPH to the semiconductor chip CPL. The semiconductor chip CPL includes a plurality of transmitting pads PL1 and a plurality of receiving pad PL2,PL3, and the semiconductor chip CPH includes a plurality of transmitting pads PH2,PH3 and a plurality of receiving pad PH1. In each of the semiconductor chip CPL,CPH, the transmitting pad is electrically connected to a transmitting circuit in the semiconductor chip, and the receiving pad is electrically connected to a reception circuit in the semiconductor chip.

Another one of the main features of the semiconductor device PKG according to the present embodiment is that in the semiconductor chip CPC, the plurality of transformer TR1,TR2,TR3 are disposed closer to the semiconductor chip CPL than the reception transformer CPC in a plan view, and the transmitting transformer CPCb is disposed along the side CPHa of the semiconductor chip CPCb in a plan view (the side CPCb opposed to the side CPHa of the semiconductor chip CPH). In the semiconductor chip CPL, the plurality of transmitting pads PL1 are arranged closer to the semiconductor chip CPH than the plurality of receiving pads PL2, PL3 in plan view.

Accordingly, in a plan view, it is possible to reduce the distance between the transmitting transformer TR1 of the semiconductor chip CPC and the plurality of transmitting pads PL1 of the semiconductor chip CPL. Therefore, the electric resistance of the conductive path connecting the plurality of transmitting pads PL1 of the semiconductor chip CPL and the primary coil (L1a) of the transmitting transformer TR1 of the semiconductor chip CPC can be reduced. Specifically, the length of the wire CPC and the length of the wire TR1 can be reduced by reducing the distance between the plurality of transmitting pads PL1 of the semiconductor chip CPL and the transmitting pad L1a of the semiconductor chip CPL, although the conductive path connecting the transmitting pad PL1 of the semiconductor chip CPC and the primary coil (L1a) of the transmitting transformer TR1 of the semiconductor chip BW1 includes the wiring WR1 and the transmitting transformer TR1 of the semiconductor chip CPC. Accordingly, when a signal is transmitted from the transmitting circuit TX1 of the semiconductor chip CPL to the receiving circuit RX1 of the semiconductor chip CPH through the transformer TR1 of the semiconductor chip CPC, degradation of the signal can be suppressed, and the signal can be accurately transmitted.

Further, as compared with the distance between the transmitting transformer CPC of the semiconductor chip TR1 and the transmitting pad CPL of the semiconductor chip PL2, the distance between the reception transformer TR2 of the semiconductor chip CPC and the receiving pad PL2 of the semiconductor chip CPL and the distance between the receiving transformer TR3 of the semiconductor chip CPC and the receiving pad CPC of the semiconductor chip CPC are large. Therefore, the lengths of one or both of the wire BW2 and the wiring WR2 are larger than the lengths of the wire BW1 and the wiring WR1, and the lengths of one or both of the wire BW3 and the wiring WR3 are larger. Therefore, compared with the electric resistance of the conductive path connecting the primary coil (L1a) of the transmitting transformer TR1 and the transmitting pad PL1, the electric resistance of the conductive path connecting the receiving pad PL2 and the secondary coil (L2a) of the receiving transformer TR2, the electric resistance of the conductive path connecting the receiving pad PL3 and the secondary coil (L3a) of the receiving transformer TR3 is increased, but it has little effect on the quality of the signal transmission.

Therefore, in the present embodiment, by reducing the distance between the transmitting transformer TR1 of the semiconductor chip CPC and the plurality of transmitting pads PL1 of the semiconductor chip CPL, it is possible to more accurately transmit signals between the semiconductor chip CPL and the semiconductor chip CPH, and thus it is possible to improve the performance of the semiconductor device.

Further, in the semiconductor chip CPL, the pad PL1, PL2,PL3 is preferably disposed along the side CPLa of the semiconductor chip CPL (the side CPLa opposite to the side CPCa of the semiconductor chip CPC) in plan view. This makes it possible to easily connect the pad CPL of the semiconductor chip PL1,PL2,PL3 to the pad PC1,PC2,PC3 of the semiconductor chip CPC with the wire BW, and to suppress the length of the wire BW (BW1, BW2, BW3) connecting the pad PL1,PL2,PL3 of the semiconductor chip CPL and the pad PC1,PC2,PC3 of the semiconductor chip CPC. Therefore, the manufacturing process of the semiconductor device PKG can be easily controlled. In addition, the performance of the semiconductor device can be further improved.

Further, in the semiconductor chip CPH, the pad PH1, PH2,PH3 is preferably disposed along the side CPHa of the semiconductor chip CPH (the side CPHa opposite to the side CPCb of the semiconductor chip CPC) in plan view. This makes it possible to easily connect the pad CPH of the semiconductor chip PH1,PH2,PH3 to the pad PC4,PC5,PC6 of the semiconductor chip CPC with the wire BW, and to suppress the length of the wire BW (BW4, BW5, BW6) connecting the pad PH1,PH2,PH3 of the semiconductor chip CPH and the pad PC4,PC5,PC6 of the semiconductor chip CPC. Therefore, the manufacturing process of the semiconductor device PKG can be easily controlled. In addition, the performance of the semiconductor device can be further improved.

Further, in the semiconductor chip CPH, it is preferable that the plurality of receiving pads PH1 are arranged closer to the semiconductor chip CPL than the plurality of transmitting pads PH2,PH3 in plan view. Accordingly, the distance between the receiving pad CPH of the semiconductor chip PH1 and the transformer CPC of the semiconductor chip CPC, the distance between the transmitting pad PH2 of the semiconductor chip CPH and the transformer TR2 of the semiconductor chip CPC, and the distance between the transmitting pad PH3 of the semiconductor chip CPH and the transformer TR3 of the semiconductor chip CPH can be reduced. Therefore, it is possible to suppress the length of the wire BW (BW4, BW5, BW6) connecting the pad PH1, PH2,PH3 of the semiconductor chip CPH and the pad PC4,PC5,PC6 of the semiconductor chip CPC. Thus, the performance of the semiconductor device can be further improved.

The present embodiment preferentially reduces the electric resistance of the conductive path connecting the pad CPL of the semiconductor chip PL1,PL2,PL3 and the transformer CPC of the semiconductor chip CPC with respect to the connection path between each pad TR1,TR2,TR3 of the semiconductor chip TR1 and the connection path between the pad PL1 of the semiconductor chip CPL and the transformer TR1 of the semiconductor chip CPC.

On the other hand, the electric resistance of the conductive path connecting the pad CPH of the semiconductor chip PH1 and the transformer CPC of the semiconductor chip TR3 can be set to be substantially the same as the electric resistance of the conductive path connecting the pad CPC of the semiconductor chip CPH and the pad PH2 of the semiconductor chip CPC to the transformer TR2 and the electric resistance of the conductive path connecting the pad PH3 of the semiconductor chip CPH to the transformer CPH. The reason is as follows. That is, in the semiconductor chip CPC, the transformer TR1,TR2,TR3 is disposed along the side CPCb of the semiconductor chip CPH in a plan view, and in the semiconductor chip CPH, the pad PH1, PH2,PH3 is disposed along the side CPHa of the semiconductor chip CPC in a plan view. This allows the distance between the pad PH1 and the transformer TR1, the distance between the pad PH2 and the transformer TR2, and the distance between the pad PH3 and the transformer TR3 to be comparable.

Therefore, it is possible to suppress the electric resistance of the conductive path connecting the transmitting pad PL1 of the semiconductor chip CPL and the primary coil (L1$a$) of the transformer TR1, the electric resistance of the conductive path connecting the transmitting pad PH2 of the semiconductor chip CPH and the primary coil (L2$b$) of the transformer TR2, and the electric resistance of the conductive path connecting the transmitting pad PH3 of the semiconductor chip CPH and the primary coil (L3$b$) of the transformer TR3. Consequently, it is possible to suppress the electric resistance of the conductive path circuit of the connecting the transmitting TX1 semiconductor chip CPL and the primary coil (L1$a$) of the transformer TR1, the electric resistance of the conductive path connecting the transmitting circuit TX2 of the semiconductor chip CPH and the primary coil (L2$b$) of the transformer TR2, and the electric resistance of the conductive path connecting the transmitting circuit TX3 of the semiconductor chip CPH and the primary coil (L3$b$) of the transformer TR3. As a result, it is possible to accurately transmit a signal between the semiconductor chip CPL and the semiconductor chip CPH via the transformer TR1,TR2,TR3, and thus it is possible to improve the performance of the semiconductor device.

First Modified Example

Next, a first modified example of the semiconductor device PKG of the present embodiment will be described.

Figure 22:
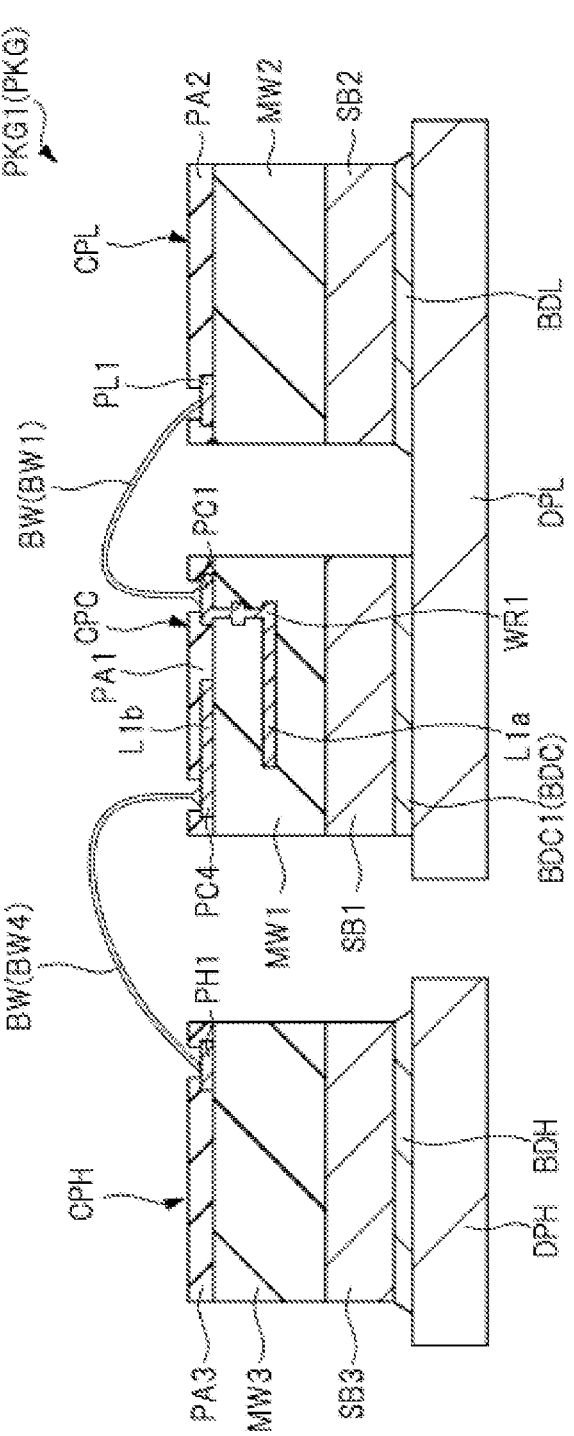
FIG. 22 is an explanatory view of a semiconductor device according to a first modified example.

FIG. 22 is an explanatory view showing the semiconductor device PKG according to the first modified example, and a cross-sectional view corresponding to FIG. 18 is shown. Hereinafter, the semiconductor device PKG according to the first modified example is referred to as a semiconductor device PKG1.

In the semiconductor device PKG1 of the first modified example shown in FIG. 22, as the bonding material BDC for mounting the semiconductor chip CPC on the die pad DPL, an insulating bonding material such as a die attach film (Die Attach Film: DAF) BDC1 having not only an adhesive material (adhesive layer) but also a base material (tape layer) is used. The breakdown voltage between the die pad DPL and the semiconductor chip CPC can be increased as compared with a conductive bonding material such as silver paste having no base material by interposing an insulating bonding material such as the die attach film BDC1 between the die pad DPL and the semiconductor chip CPC.

Second Modified Example

Next, a second modified example of the semiconductor device PKG of the present embodiment will be described.

Figure 23:
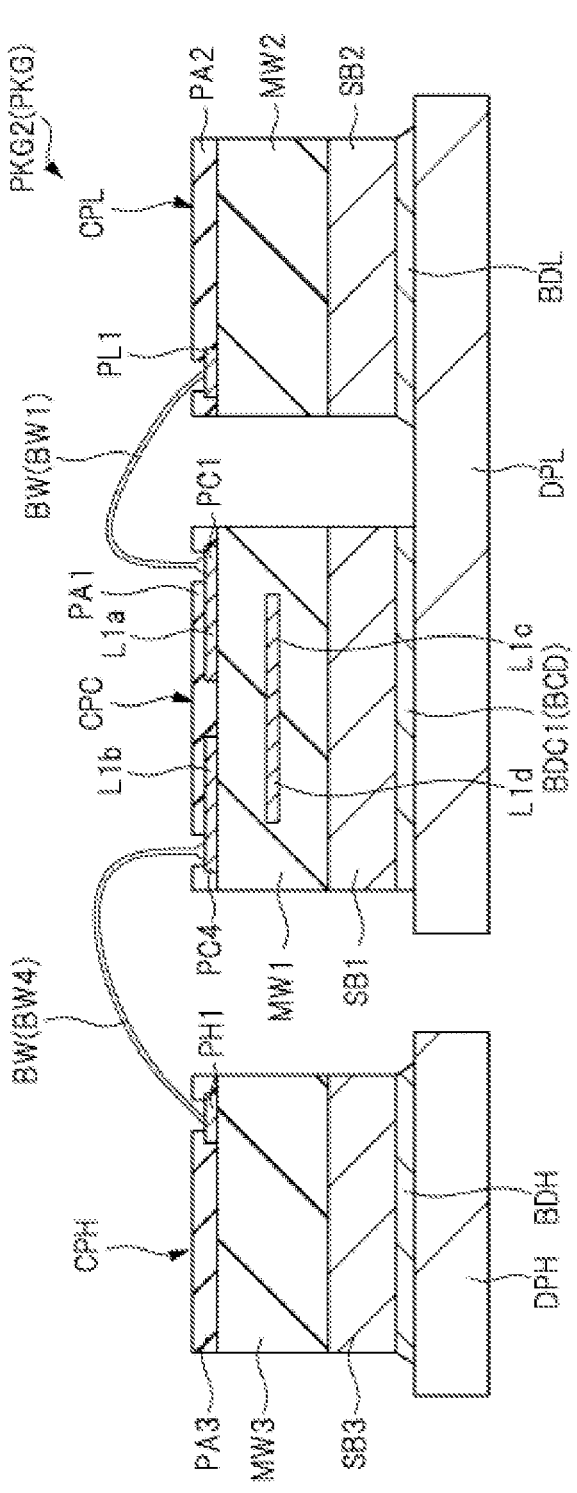
FIG. 23 is an explanatory view of a semiconductor device according to a second modified example.
Figure 24:
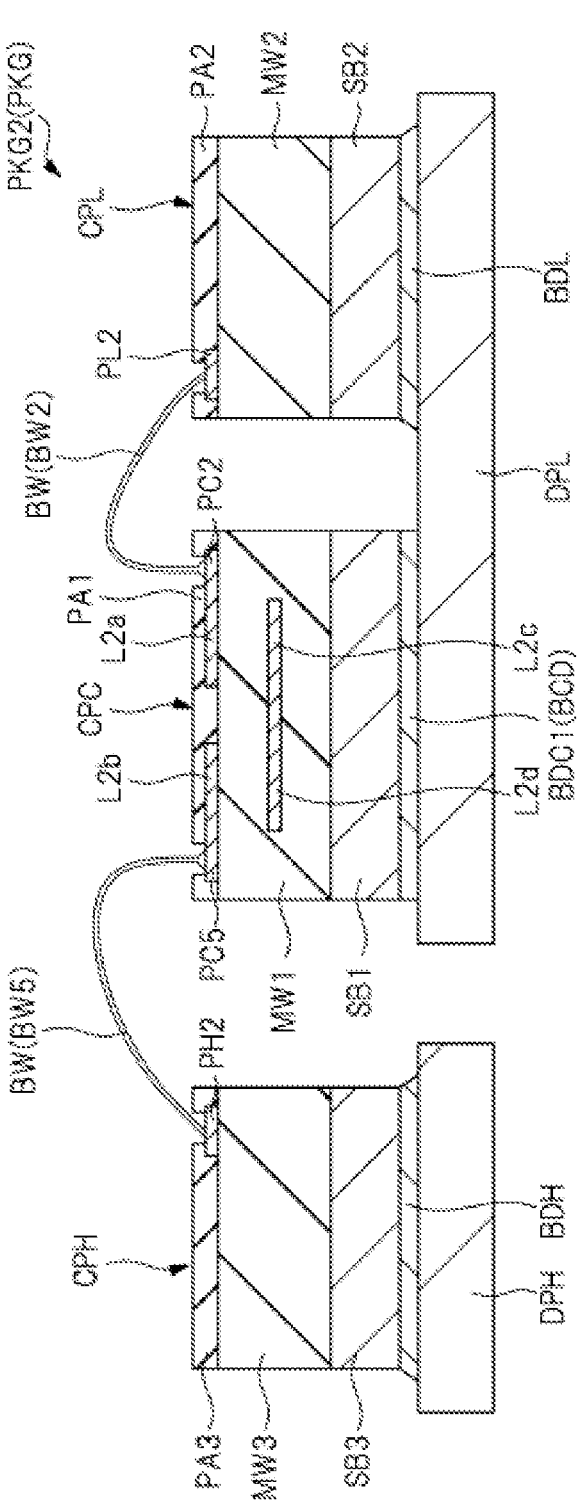
FIG. 24 is an explanatory view of a semiconductor device according to the second modified example.
Figure 25:
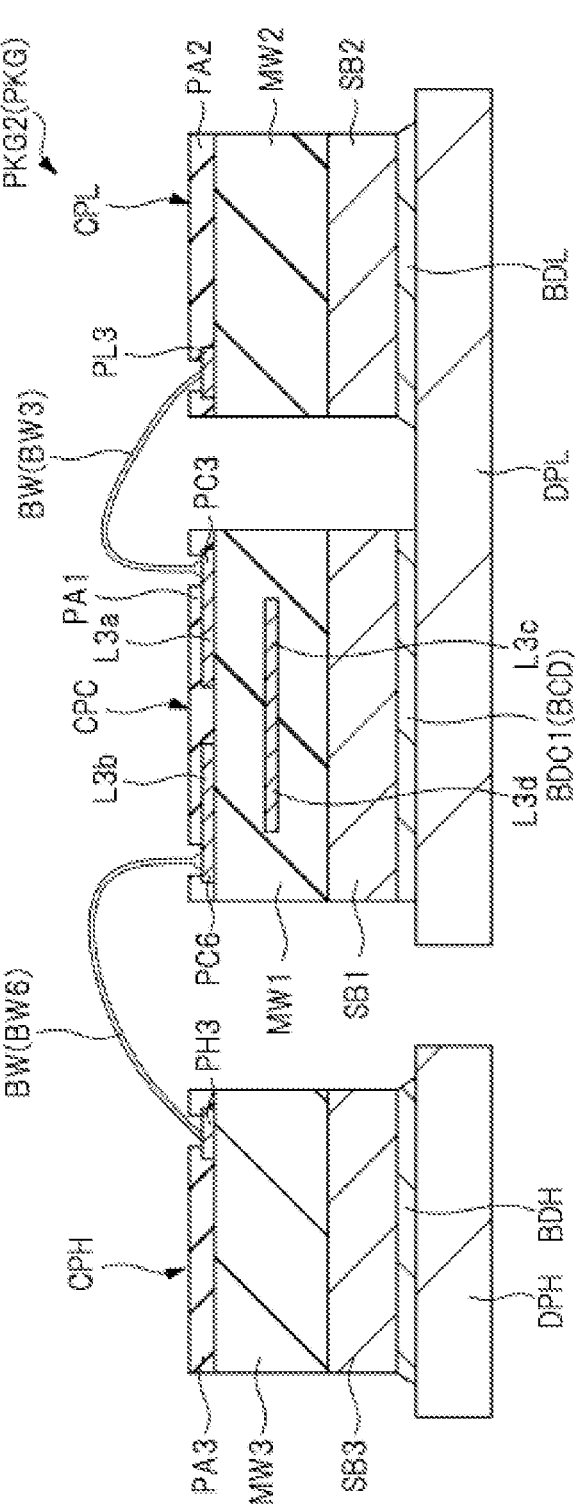
FIG. 25 is an explanatory view of a semiconductor device according to the second modified example.

FIGS. 23 to FIG. 25 are an explanatory view showing the semiconductor device PKG according to the second modified example. FIG. 23 shows a cross-sectional view corresponding to FIG. 18, FIG. 24 shows a cross-sectional view corresponding to FIG. 19, and FIG. 25 shows a cross-sectional view corresponding to FIG. 20. Hereinafter, the semiconductor device PKG according to the second modified example is referred to as a semiconductor device PKG2.

In the semiconductor device PKG2 of the second modified example shown in FIGS. 23 to 25, the configuration of the transformer TR1,TR2,TR3 in the semiconductor chip CPC is different from the semiconductor device PKG shown in FIGS. 18 to 20. Hereinafter, the semiconductor device PKG2 of the second modified example shown in FIGS. 23 to 25 is different from the semiconductor device PKG shown in FIGS. 18 to 20.

In the semiconductor device PKG2 of the second modified example, in the multi-layer wiring structure MW1 of the semiconductor chip CPC, the coil L1$a$ and the coil L1$b$ composing the transformer TR1 do not overlap in plan view, and are formed in the same wiring layer (see FIG. 23). In the multi-layer wiring structure MW1 of the semiconductor chip CPC, a coil L1$a$ is provided below the coil L1$c$, and a coil L1$d$ is provided below the coil CPC (see FIG. 23). The coil L1$a$ and the coil L1$c$ below it are not connected by conductors but are magnetically coupled to each other. The coil L1$b$ and the coil L1$d$ below the coil are not connected by conductors, but are magnetically coupled to each other. On the other hand, since the coil L1$c$ and the coil L1$d$ are connected by conductors, they are electrically connected. Therefore, the coil L1$a$ and the coil L1$d$ are magnetically coupled to each other.

Further, in the multi-layer wiring structure MW1 of the semiconductor chip CPC, the coil L2$a$ and the coil L2$b$ composing the transformer TR2 do not overlap each other in plan view, and are formed in the same wiring layers (see FIG. 24). In the multi-layer wiring structure MW1 of the semiconductor chip CPC, a coil L2$a$ is provided below the coil L2$c$, and a coil L2$d$ is provided below the coil CPC (see FIG. 24). The coil L2$a$ and the coil L2$c$ below it are not connected by conductors but are magnetically coupled to each other. The coil L2$b$ and the coil L2$d$ below the coil are not connected by conductors, but are magnetically coupled to each other. On the other hand, since the coil L2$c$ and the coil L2$d$ are connected by conductors, they are electrically connected. Therefore, the coil L2$a$ and the coil L2$d$ are magnetically coupled to each other.

Further, in the multi-layer wiring structure MW1 of the semiconductor chip CPC, the coil L3$a$ and the coil L3$b$ composing the transformer TR3 do not overlap each other in plan view, and are formed in the same wiring layers (see FIG. 25). In the multi-layer wiring structure MW1 of the semiconductor chip CPC, a coil L3$a$ is provided below the coil L3$c$, and a coil L3$d$ is provided below the coil CPC (see FIG. 25). The coil L3$a$ and the coil L3$c$ below it are not connected by conductors but are magnetically coupled to each other. The coil L3$b$ and the coil L3$d$ below the coil are not connected by conductors, but are magnetically coupled to each other. On the other hand, since the coil L3$c$ and the coil L3$d$ are connected by conductors, they are electrically connected. Therefore, the coil L3$a$ and the coil L3$d$ are magnetically coupled to each other.

The transformer TR1 is formed by a coil L1$a$,L1$b$,L1$c$, L1$d$ formed in the semiconductor chip CPC, the transformer TR2 is formed by a coil L2$a$,L2$b$,L2$c$,L2$d$ formed in the semiconductor chip CPC, and the transformer TR3 is formed by a coil L3$a$,L3$b$,L3$c$,L3$d$ formed in the semiconductor chip CPC. Each of the coil L1$a$,L1$b$,L1$c$,L1$d$,L2$a$,L2$b$,L2$c$, L2$d$,L3$a$,L3$b$,L3$c$,L3$d$ is formed by a spiral conductive pattern (wiring pattern).

When a current flows from the transmitter TX1 to the coil L1$a$ of the transformer TR1 to the coil L1$a$, an induced electromotive force is generated in the coil L1$c$ in response to a change in the current, and an induced current flows. When an induced current flows in the coil L1$c$ because the coil L1$c$ and the coil L1$d$ are electrically connected to each other, the current inevitably also flows in the coil L1$d$. When a current flows in the coil L1$d$, an induced electromotive force is generated in the coil L1$b$ in accordance with a change in the current, and an induced current flows. That is, when a current flows in the coil L1$a$ (primary coil), an induced electromotive force is generated in the coil L1$b$ (secondary coil) in accordance with a change in the current, and an induced current flows. Therefore, even in the semiconductor device PKG2 of the second modified example, the coil L1a functions as the primary coil, and the coil L1b functions as the secondary coil. The same applies to the transformer TR2,TR3, but in the case of the transformer TR2, the coil L2b functions as the primary coil, the coil L2a functions as the secondary coil, and in the case of the transformer TR3, the coil L3b functions as the primary coil, and the coil L3a functions as the secondary coil. In the multi-layer wiring structure MW1 of the semiconductor chip CPC, the coil L1a, the coil L1b, the coil L2a, the coil L2b, the coil L3a, and the coil L3b are preferably formed in the same layer. Further, in the multi-layer wiring structure MW1 of the semiconductor chip CPC, the coil L1c, the coil L1d, the coil L2c, the coil L2d, the coil L3c, and the coil L3d are preferably formed in the same layer.

Therefore, even in the second modified example the semiconductor device PKG2, a signal is transmitted from the transmitting circuit TX1 to the coil TR1 (primary coil) of the transformer L1a to flow a current, and accordingly, a signal can be transmitted from the transmitting circuit TX1 to the receiving circuit RX1 through the transformer TR1 by detecting (receiving) an induced current (or induced electromotive force) generated in the coil L1b (secondary coil) of the transformer L1a by the receiving circuit RX1. Further, it is possible to transmit a signal from the transmitting circuit TX2 to the receiving circuit RX2 through the transformer TR2. Further, it is possible to transmit a signal from the transmitting circuit TX3 to the receiving circuit RX3 through the transformer TR3.

In the semiconductor device PKG2 of the second modified example shown in FIGS. 23 to 25, an insulating bonding material such as the die attach film BDC1 is used as the bonding material BDC for mounting the semiconductor chip CPC on the die pad DPL. Accordingly, the breakdown voltage between the die pad DPL and the semiconductor chip CPC can be increased.

In the case of the semiconductor device PKG2 of the second modified example shown in FIGS. 23 to 25, the thickness of the interlayer insulating film composing the multilayer wiring structure MW1 of the semiconductor chip CPC (and therefore the thickness of the multilayer wiring structure MW1) can be made thinner than in the case of the semiconductor device PKG shown in FIGS. 18 to 20. The reason is as follows. That is, in the semiconductor device PKG shown in FIGS. 18 to 20, the thickness of the interlayer insulating film interposed between each coil L1b,L2b,L3b in the semiconductor chip CPC and each coil L1a,L2a,L3a needs to be increased to ensure the breakdown voltage between each coil L1b,L2b,L3b connected to the semiconductor chip CPH and each coil L1a,L2a,L3a connected to the semiconductor chip CPL. In contrast, in the semiconductor device PKG shown in FIGS. 23 to 25, the breakdown voltage between each coil L1b,L2b,L3b connected to the semiconductor chip CPH and each coil L1a,L2a,L3a connected to the semiconductor chip CPL can be ensured without increasing the thickness of the interlayer insulating film interposed between each coil L1a,L1b,L2a,L2b,L3a, L3b in the semiconductor chip CPC and each coil L1c,L1d, L2c,L2d,L3c,L3d. Therefore, in the semiconductor device PKG2 of the second modified example shown in FIGS. 23 to 25, the thickness of the interlayer insulating film composing the multilayer wiring structure MW1 of the semiconductor chip CPC (and therefore the thickness of the multilayer wiring structure MW1) can be reduced. The breakdown voltage between the semiconductor chip CPC and the die pad DPL can be ensured by the die attach film BDC1.

Therefore, in the case of the semiconductor device PKG2 of the second modified example shown in FIGS. 23 to 25, the thickness of the semiconductor chip CPC can be reduced as compared with the case of the semiconductor device PKG shown in FIGS. 18 to 20. In addition, the respective thicknesses of the semiconductor chip CPL,CPH can be reduced in accordance with the reduction in the thickness of the semiconductor chip CPC. Therefore, in the semiconductor device PKG2 of the second modified example shown in FIGS. 23 to 25, the thickness of the semiconductor device PKG2 can be reduced.

In addition, in the semiconductor device PKG2 of the second modified example shown in FIGS. 23 to 25, the thickness of the interlayer insulating film composing the multilayer wiring structure MW1 of the semiconductor chip CPC can be reduced, so that the semiconductor chip CPC can be easily manufactured, and the manufacturing yield of the semiconductor chip CPC can be improved. This is because if the interlayer insulating film formed on the semiconductor wafer is thick, the semiconductor wafer is easily warped, but if the interlayer insulating film can be made thin, the warpage of the semiconductor wafer can be suppressed.

Second Embodiment

Figure 26:
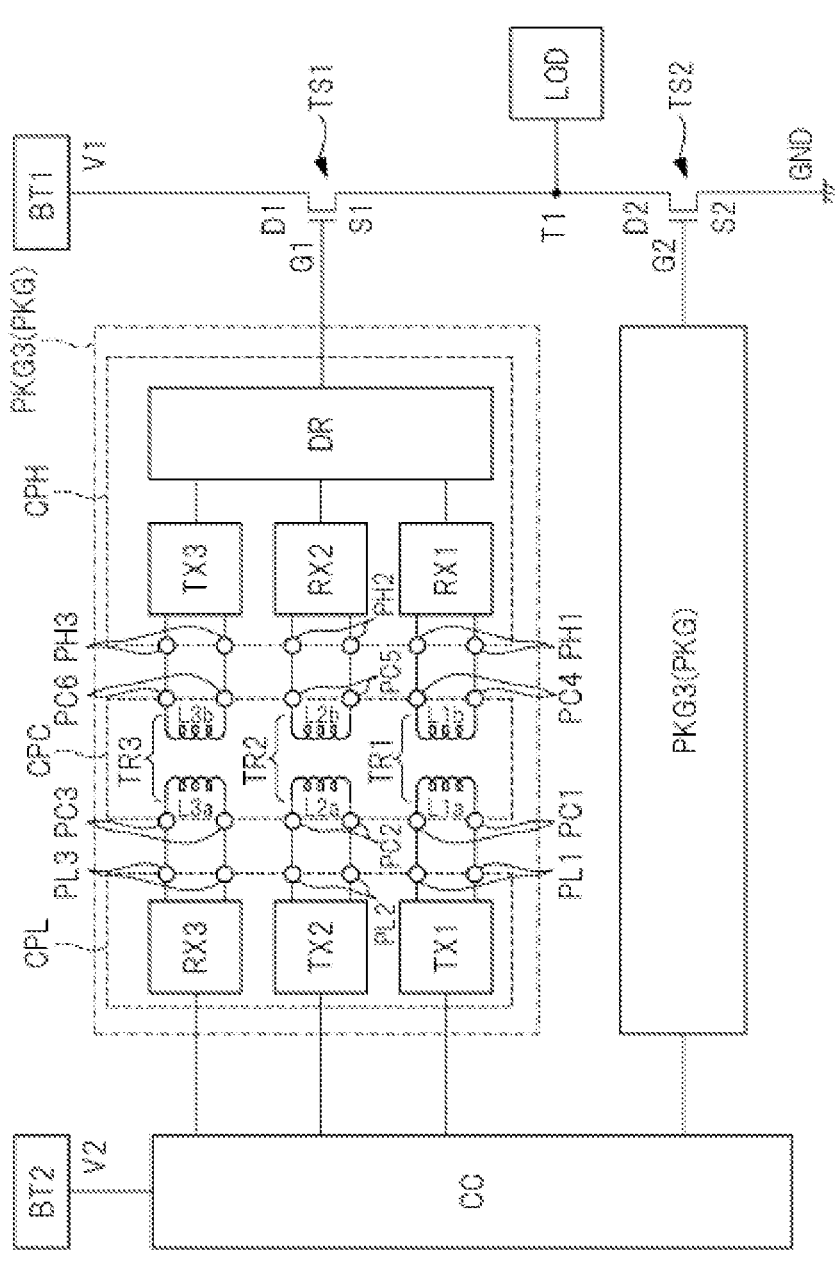
FIG. 26 is a circuit diagram showing an inverter circuit using a semiconductor device according to another embodiment.

FIG. 26 is a circuit diagram showing an inverter circuit using a semiconductor device PKG according to the present second embodiment, and corresponds to FIG. 1. Hereinafter, the semiconductor device PKG of the present second embodiment is referred to as a semiconductor device PKG3. Further, in the following, the second embodiment mainly describes that the semiconductor device PKG3 of the first embodiment is different from the semiconductor device PKG of the first embodiment, and the semiconductor device PKG3 of the first embodiment is the same as the semiconductor device PKG of the first embodiment, and repetitive explanation thereof is omitted.

The circuit configuration of the semiconductor device PKG3 of the present second embodiment shown in FIG. 26 is different from the circuit configuration of the semiconductor device PKG of the first embodiment shown in FIG. 1 in the following points. That is, in the semiconductor device PKG of the first embodiment, as can be seen from FIG. 1, the receiving circuit RX2 is formed on the semiconductor chip CPL, and the transmitting circuit TX2 is formed on the semiconductor chip CPH. On the other hand, in the present second embodiment the semiconductor device PKG3, as can be seen from FIG. 26, the receiving circuit RX2 is formed not on the semiconductor chip CPL but on the semiconductor chip CPH, and the transmitting circuit TX2 is formed not on the semiconductor chip CPH but on the semiconductor chip CPL. Therefore, in the second embodiment of the semiconductor device PKG3, the pad CPL of the semiconductor chip PL2 is electrically connected to the receiving circuit RX2 in the semiconductor chip CPH through the internal wiring of the semiconductor chip CPL and the pad PH2 of the semiconductor chip CPH is electrically connected to the transmitting circuit TX1 in the semiconductor chip CPL.

Therefore, in the above first embodiment, the transformer TR2 is a receiving transformer used for transmitting a signal transmitted by the semiconductor chip CPH to the semiconductor chip CPL and receiving the signal at the semiconductor chip CPL, but in the present second embodiment, the transformer TR2 is a transmitting transformer used for transmitting a signal transmitted by the semiconductor chip CPL to the semiconductor chip CPH. In addition, in the above first embodiment, the coil TR2 of the transformer is the primary coil, and the coil L2b of the transformer TR2 is the secondary coil, but in the present second embodiment, the coil L2b of the transformer TR2 is the primary coil, and the coil L2a of the transformer TR2 is the secondary coil. In addition, in the above first embodiment, the pad CPL of the semiconductor chip PL2 is a receiving pad, and the pad CPH of the semiconductor chip PH2 is a transmitting pad, but in the present second embodiment, the pad PL2 of the semiconductor chip CPL is a transmitting pad connected to the transmitting circuit TX2, and the pad PH2 of the semiconductor chip CPH is a receiving pad connected to the receiving circuit RX2.

Figure 27:
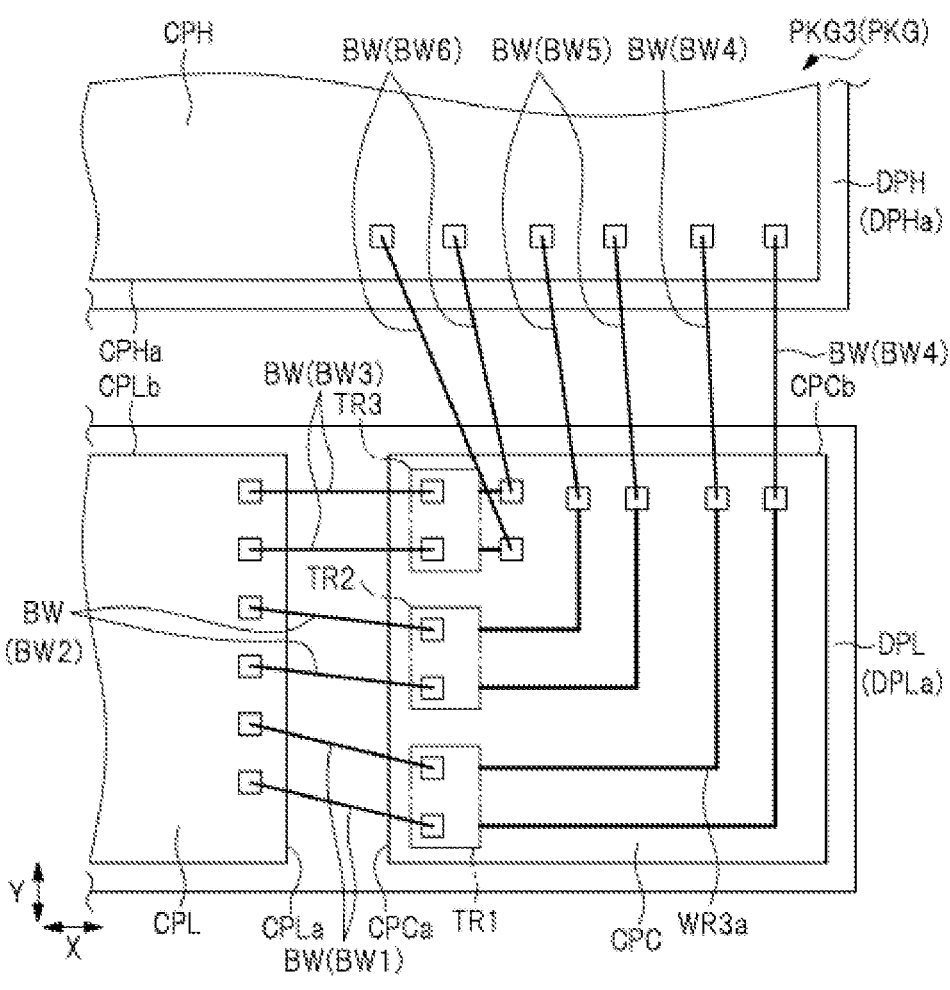
FIG. 27 is an enlarged perspective plan view of a portion of the semiconductor device according to the another embodiment.
Figure 28:
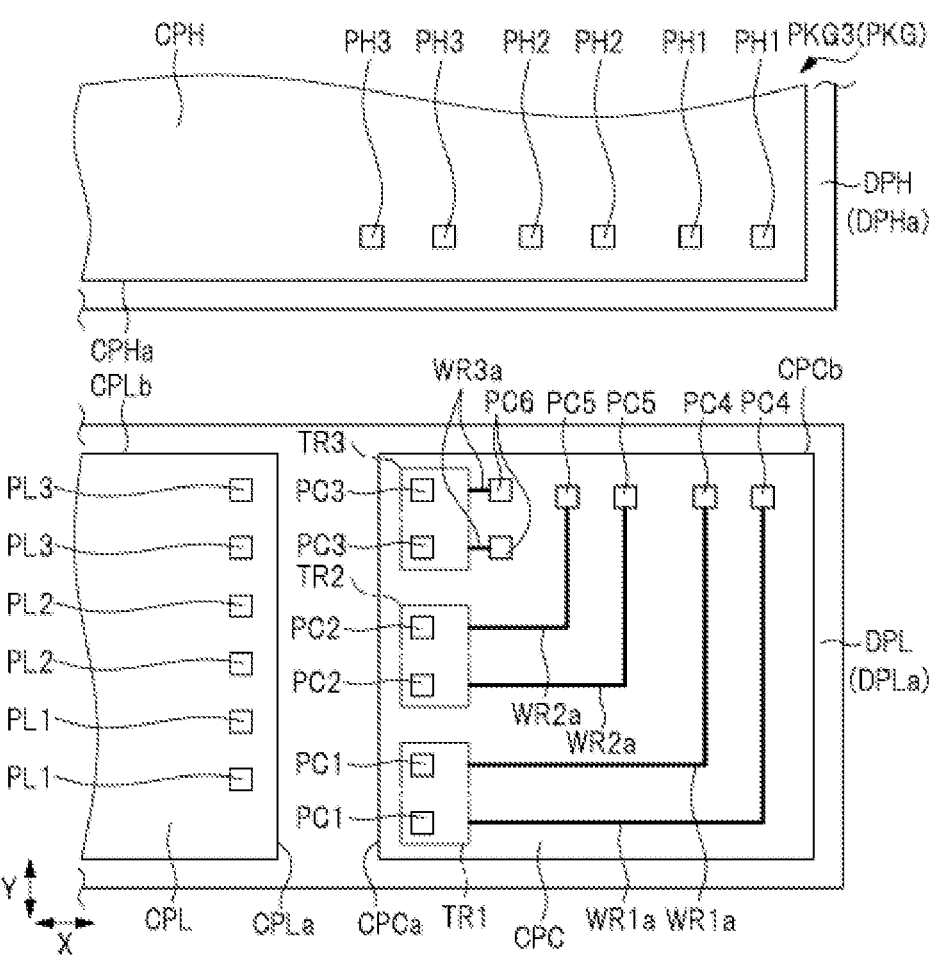
FIG. 28 is an enlarged perspective plan view of a portion of the semiconductor device according to the another embodiment.

FIG. 27 and FIG. 28 are an enlarged perspective plan view of a portion of the semiconductor device PKG3 according to the present second embodiment. FIG. 27 corresponds to FIG. 16, and FIG. 27 shows a portion of each of the semiconductor chip CPC, the semiconductor chip CPH and the semiconductor chip CPL in the semiconductor device PKG3 when the sealing portion MR is seen through. FIG. 28 corresponds to FIG. 17, and shows a portion of each of the semiconductor chip CPC, the semiconductor chip CPH, and the semiconductor chip CPL in the semiconductor device PKG3 when the wire BW is further seen through (omitted) in FIG. 27.

The wiring WR1a,WR2a,WR3a shown in FIGS. 27 and 28 is a wiring included in the multi-layer wiring structure MW1 of the semiconductor chip CPC. Both ends of the coil TR1 composing the transformer L3b are connected to the pad L1b through the wiring WR1a, respectively, and both ends of the coil PC4 composing the transformer TR2 are connected to the pad PC6 through the wiring WR2a, respectively, and both ends of the coil L2b composing the transformer TR3 are connected to the pad TR3 through the wiring PC5.

In the present second embodiment, as can be seen from FIGS. 27 and 28, in the semiconductor chip CPC, the transformer TR1,TR2,TR3 is arranged along the side CPCa of the semiconductor chip CPC (the side CPCa opposite to the side CPLa of the semiconductor chip CPL) in a plan view. The transformer TR1,TR2,TR3 do not overlap each other in plan view, and are separated from each other in plan view.

Further, in the present second embodiment, as can be seen from FIGS. 27 and 28, in the semiconductor chip CPC, the reception transformer TR3 is disposed closer to the semiconductor chip CPH than the transmitting transformer TR1, TR2 in a plan view. That is, the distance (interval) between the reception transformer TR3 and the semiconductor chip CPH in the Y direction is smaller than the distance (interval) between the transmitting transformer TR1 and the semiconductor chip CPH in the Y direction, and is smaller than the distance (interval) between the reception transformer TR2 and the semiconductor chip CPH in the Y direction. In FIGS. 27 and 28, of the transformer TR1,TR2,TR3, the reception transformer TR3 is located closest to the semiconductor chip CPH, the transmitting transformer TR1 is located farthest from the semiconductor chip CPH, and the transmitting transformer TR2 is located between the transmitting transformer TR1 and the reception transformer CPH. In another aspect, in the semiconductor chip CPC, the position of the transmitting transformer TR2 and the position of the transmitting transformer TR1 can be interchanged, but even in such cases, the reception transformer TR3 of the transformer TR1,TR2,TR3 is located closest to the semiconductor chip CPH.

Further, in the present second embodiment, as can be seen from FIGS. 27 and 28, in the semiconductor chip CPC, the pad PC1,PC2,PC3 is arranged along the side CPCa of the semiconductor chip CPC in a plan view. In the semiconductor chip CPC, the pad PC3 is disposed closer to the semiconductor chip CPH than the pad PC1,PC2 in a plan view. That is, the distance between the pad PC3 and the semiconductor chip CPH in the Y direction is smaller than the distance between the pad PC2 and the semiconductor chip CPH in the Y direction and smaller than the distance between the pad PC1 and the semiconductor chip CPH in the Y direction. In FIGS. 27 and 28, of the pad PC1,PC2,PC3, the pad PC3 is located closest to the semiconductor chip CPH, the pad PC1 is located farthest from the semiconductor chip CPH, and the pad PC2 is located between the pad PC1 and the pad PC3. In another aspect, in the semiconductor chip CPC, when the position of the transmitting transformer TR1 and the position of the transmitting transformer TR2 are interchanged, it is preferable to interchange the position of the pad PC1 and the position of the pad PC2 in the semiconductor chip CPC.

Further, in the present second embodiment, as can be seen from FIGS. 27 and 28, in the semiconductor chip CPH, the pad PH1,PH2,PH3 is arranged along the side CPHa of the semiconductor chip CPH in a plan view. In the semiconductor chip CPH, the transmitting pad PH3 is disposed closer to the semiconductor chip CPL than the receiving pad PH1,PH2 in plan view. That is, the distance between the transmitting pad PH3 and the semiconductor chip CPL in the X direction is smaller than the distance between the receiving pad PH1 and the semiconductor chip CPL in the X direction and smaller than the distance between the receiving pad PL2 and the semiconductor chip CPL in the X direction. In FIGS. 27 and 28, among the pad PH1,PH2, PH3, the transmitting pad PH3 is located closest to the semiconductor chip CPL, the receiving pad PH1 is located farthest from the semiconductor chip CPL, and the receiving pad PH2 is located between the transmitting pad PH3 and the receiving pad PH1. In another aspect, when the position of the transmitting transformer TR1 and the position of the transmitting transformer TR2 are interchanged in the semiconductor chip CPC, it is preferable that the position of the receiving pad PH1 and the position of the receiving pad PH2 are interchanged in the semiconductor chip CPH.

Further, in the present second embodiment, as can be seen from FIGS. 27 and 28, in the semiconductor chip CPL, the pad PL1,PL2,PL3 is arranged along the side CPLa of the semiconductor chip CPL in a plan view. In the semiconductor chip CPL, the receiving pad PL3 is disposed closer to the semiconductor chip CPH than the transmitting pad PL1,PL2 in a plan view. That is, in plan view, the distance (interval) between the receiving pad PL3 and the semiconductor chip CPH in the Y direction is smaller than the distance (interval) between the transmitting pad PL1 and the semiconductor chip CPH in the Y direction, and is smaller than the distance (interval) between the transmitting pad PL2 and the semiconductor chip CPH in the Y direction. In FIGS. 27 and 28, of the pad PL1,PL2,PL3, the receiving pad PL3 is located closest to the semiconductor chip CPH, the transmitting pad PL1 is located farthest from the semiconductor chip CPH, and the transmitting pad PL2 is located between the receiving pad PL3 and the transmitting pad PL1. In another aspect, when the position of the transmitting transformer TR1 and the position of the transmitting transformer TR2 are interchanged in the semiconductor chip CPC, it is preferable that the position of the transmitting pad PL1 and the position of the transmitting pad PL2 are interchanged in the semiconductor chip CPL.

Next, the main features and advantages of the present second embodiment will be described.

The die pad DPL,DPH and the semiconductor chip CPC, CPL,CPH are arranged in the same manner as the semiconductor device PKG of the first embodiment in the semiconductor device PKG3 of the present second embodiment.

Therefore, similarly to the above first embodiment, in the present second embodiment, the dimension in the Y direction of the semiconductor device PKG3 can be reduced even if the aspect ratio (the ratio of the dimension in the X direction to the dimension in the Y direction) of each of the semiconductor chip CPC,CPL is not increased. Therefore, it is possible to reduce the size of the semiconductor device. Further, since the aspect ratio of each of the semiconductor chip CPC,CPL can be suppressed, it is possible to suppress the risk of cracks occurring in the semiconductor chip CPL,CPC, for example, when a semiconductor chip is obtained by cutting a semiconductor wafer or when a semiconductor chip is conveyed. Therefore, the manufacturing yield of the semiconductor chip CPL,CPC and the manufacturing yield of the semiconductor device PKG3 can be improved. Also in the semiconductor device PKG3, since the semiconductor chip CPH,CPL,CPC can be arranged in a well-balanced manner in the sealing portion MR, it is possible to reduce the difference between the amount (volume) of the sealing resin located around the semiconductor chip CPH, the amount (volume) of the sealing resin located around the semiconductor chip CPL, and the amount (volume) of the sealing resin located around the semiconductor chip CPC. Consequently, warpage of the semiconductor device PKG3 can be suppressed or prevented, and flatness of the semiconductor device PKG3 can be improved.

The semiconductor device PKG3 of the present second embodiment incorporates the semiconductor chip CPC,CPL, CPH, and the semiconductor chip CPC includes one or more transmitting transformers (in this case, a transformer TR1, TR2) and one or more receiving transformers (in this case, a transformer TR3). The semiconductor chip CPL includes the plurality of transmitting pad PL1,PL2 and a plurality of receiving pad PL3, and the semiconductor chip CPH includes a plurality of transmitting pad PH3 and the plurality of receiving pad PH1,PH2.

In the present second embodiment the semiconductor device PKG3, in the semiconductor chip CPC, the plurality of transformer TR1,TR2,TR3 are arranged closer to the semiconductor chip CPH than the transmitting transformer TR1,TR2 in a plan view along the side CPCa of the semiconductor chip CPC in a plan view (the side CPCa opposed to the side CPLa of the semiconductor chip CPL). In the semiconductor chip CPH, the plurality of transmitting pads PL3 are arranged closer to the semiconductor chip CPL than the plurality of receiving pads PL1,PL2 in plan view.

This makes it possible to reduce the distance between the receiving transformer TR3 of the semiconductor chip CPC and the plurality of transmitting pads PH3 of the semiconductor chip CPH in plan view. Therefore, the electric resistance of the conductive path connecting the plurality of transmitting pads PH3 of the semiconductor chip CPH and the primary coil (L3b) of the receiving transformer TR3 of the semiconductor chip CPC can be reduced. Specifically, the conductive path connecting the transmitting pad PH3 of the semiconductor chip CPH and the primary coil (L3b) of the receiving transformer TR3 of the semiconductor chip CPC includes the wire BW6 and the wiring WR3a, but the length of the wire BW6 and the length of the wiring WR3a can be reduced by reducing the distance between the receiving transformer TR3 of the semiconductor chip CPC and the transmitting pad PH3 of the semiconductor chip CPH. Accordingly, when a signal is transmitted from the transmitting circuit TX3 of the semiconductor chip CPH to the receiving circuit RX3 of the semiconductor chip CPL through the transformer TR3 of the semiconductor chip CPC, the degradation of the signal can be suppressed, and the signal can be accurately transmitted.

Further, as compared with the distance between the receiving transformer CPC of the semiconductor chip TR3 and the transmitting pad CPH of the semiconductor chip PL1, the distance between the transmitting transformer TR2 of the semiconductor chip CPC and the receiving pad PL2 of the semiconductor chip CPH, and the distance between the transmitting transformer TR1 of the semiconductor chip CPC and the receiving pad CPC of the semiconductor chip CPC is large. Therefore, the lengths of one or both of the wire BW5 and the wiring WR2a are larger than the lengths of the wire BW6 and the wiring WR3a, and the lengths of one or both of the wire BW4 and the wiring WR1a are larger. Therefore, compared with the electric resistance of the conductive path connecting the primary coil (L3b) of the transmitting pad PH3 and the reception transformer TR3, the electric resistance of the conductive path connecting the receiving pad PH2 and the secondary coil (L2b) of the transmitting transformer TR2, the electric resistance of the conductive path connecting the receiving pad PH1 and the secondary coil (L1b) of the transmitting transformer TR1 is increased, but it has little effect on the quality of the signal transmission.

Therefore, in the present second embodiment, by reducing the distance between the reception transformer TR3 of the semiconductor chip CPC and the plurality of transmitting pads PH3 of the semiconductor chip CPH, it is possible to more accurately transmit signals between the semiconductor chip CPH and the semiconductor chip CPL, and thus it is possible to improve the performance of the semiconductor device.

Further, in the semiconductor chip CPH, the pad PH1, PH2,PH3 is preferably disposed along the side CPHa of the semiconductor chip CPH (the side CPLa facing the side CPCb of the semiconductor chip CPC) in a plan view. This makes it possible to easily connect the pad CPH of the semiconductor chip PH1,PH2,PH3 to the pad PC4,PC5,PC6 of the semiconductor chip CPC with the wire BW, and to suppress the length of the wire BW (BW4, BW5, BW6 connecting the pad PH1,PH2,PH3 of the semiconductor chip CPH and the pad PC4,PC5,PC6 of the semiconductor chip CPC. Therefore, the manufacturing process of the semiconductor device can be easily controlled. In addition, the performance of the semiconductor device can be further improved.

Further, in the semiconductor chip CPL, the pad PL1, PL2,PL3 is preferably disposed along the side CPLa of the semiconductor chip CPL (the side CPLa opposite to the side CPCa of the semiconductor chip CPC) in plan view. This makes it possible to easily connect the pad CPL of the semiconductor chip PL1,PL2,PL3 to the pad PC1,PC2,PC3 of the semiconductor chip CPC with the wire BW, and to suppress the length of the wire BW (BW1, BW2, BW3 connecting the pad PL1,PL2,PL3 of the semiconductor chip CPL and the pad PC1,PC2,PC3 of the semiconductor chip CPC. Therefore, the manufacturing process of the semiconductor device can be easily controlled. In addition, the performance of the semiconductor device can be further improved.

Further, in the semiconductor chip CPL, it is preferable that the plurality of receiving pads PL3 are arranged closer to the semiconductor chip CPH than the plurality of transmitting pads PL1,PL2 in plan view. Accordingly, the distance between the receiving pad CPL of the semiconductor chip PL3 and the transformer CPC of the semiconductor chip CPC, the distance between the transmitting pad PL2 of the semiconductor chip CPL and the transformer TR2 of the semiconductor chip CPC, and the distance between the transmitting pad PL1 of the semiconductor chip CPL and the transformer TR1 of the semiconductor chip CPL can be reduced. Therefore, it is possible to suppress the length of the wire BW (BW1, BW2, BW3) connecting the pad PL1, PL2,PL3 of the semiconductor chip CPL and the pad PC1, PC2,PC3 of the semiconductor chip CPC. Thus, the performance of the semiconductor device can be further improved.

In the present second embodiment, the electric resistance of the conductive path connecting the pad CPH of the semiconductor chip PH1,PH2,PH3 and the transformer CPC of the semiconductor chip CPC is preferentially reduced with respect to the connection path between each pad TR1,TR2,TR3 of the semiconductor chip TR3 and the connection path between the pad PH3 of the semiconductor chip CPH and the transformer TR3 of the semiconductor chip CPC.

On the other hand, the electric resistance of the conductive path connecting the pad CPL of the semiconductor chip PL1 and the transformer CPC of the semiconductor chip TR3 can be set to be substantially the same as the electric resistance of the conductive path connecting the pad CPC of the semiconductor chip CPL and the pad PL2 of the semiconductor chip CPC to the transformer TR2 and the electric resistance of the conductive path connecting the pad PL3 of the semiconductor chip CPL to the transformer CPL. The reason is as follows. That is, in the semiconductor chip CPC, the transformer TR1,TR2,TR3 is disposed along the side CPCa of the semiconductor chip CPL in a plan view, and in the semiconductor chip CPL, the pad PL1,PL2,PL3 is disposed along the side CPLa of the semiconductor chip CPC in a plan view. This allows the distance between the pad PL1 and the transformer TR1, the distance between the pad PL2 and the transformer TR2, and the distance between the pad PL3 and the transformer TR3 to be comparable.

Therefore, it is possible to suppress the electric resistance of the conductive path connecting the transmitting pad CPL of the semiconductor chip PH3 and the primary coil (L1a) of the transformer TR1, the electric resistance of the conductive path connecting the transmitting pad TR3 of the semiconductor chip CPL and the primary coil (L3b) of the transformer PL1, and the electric resistance of the conductive path connecting the transmitting pad PL2 of the semiconductor chip TR2 and the primary coil (L2a) of the transformer TR2. Consequently, it is possible to suppress the electric resistance of the conductive path connecting the transmitting circuit CPL of the semiconductor chip TX3 and the primary coil (L1a) of the transformer TR1, the electric resistance of the conductive path connecting the transmitting circuit TR3 of the semiconductor chip CPL and the primary coil (L3b) of the transformer TX1, and the electric resistance of the conductive path connecting the transmitting circuit TX2 of the semiconductor chip TR2 and the primary coil (L2a) of the transformer TR2. As a result, it is possible to accurately transmit a signal between the semiconductor chip CPL and the semiconductor chip CPH via the transformer TR1,TR2,TR3, and thus it is possible to improve the performance of the semiconductor device.

The first embodiment is particularly suitable when the number of receiving transformers is larger than the number of transmitting transformers in the plurality of transformers included in the semiconductor chip CPC. In the above first embodiment, the transformer TR1 corresponds to the transmitting transformer, and the transformer TR2,TR3 corresponds to the receiving transformer.

The present second embodiment is particularly suitable when the number of transmitting transformers is larger than the number of receiving transformers in a plurality of transformers included in the semiconductor chip CPC. For the present second embodiment, the transformer TR1,TR2 corresponds to the transmit transformer and the transformer TR3 corresponds to the receive transformer.

Further, the first modified example and the second modified example of the first embodiment can be applied to the present second embodiment.

The invention made by the present inventor has been described above in detail based on the embodiment, but the present invention is not limited to the embodiment described above, and it is needless to say that various modifications can be made without departing from the gist thereof.

What is claimed is:

1. A semiconductor device comprising:
   a first chip mounting portion;
   a second chip mounting portion;
   a first semiconductor chip mounted on the first chip mounting portion;
   a second semiconductor chip mounted on the second chip mounting portion;
   a third semiconductor chip mounted on the first chip mounting portion and having a plurality of transformers; and
   a sealing body sealing the first semiconductor chip, the second semiconductor chip, the third semiconductor chip, the first chip mounting portion and the second chip mounting portion,
   wherein each of the plurality of transformers has a primary coil and a secondary coil that are magnetically coupled to each other,
   wherein the first chip mounting portion and the second chip mounting portion are adjacent to each other in a first direction,
   wherein the first semiconductor chip and the third semiconductor chip are adjacent to each other in a second direction that is perpendicular to the first direction,
   wherein, in plan view, the third semiconductor chip has:
      a third side facing a first side of the first semiconductor chip; and
      a fourth side facing a second side of the second semiconductor chip,
   wherein, in plan view, the plurality of transformers is arranged along the fourth side of the third semiconductor chip,
   wherein the first semiconductor chip has:
      a plurality of first transmitting pads electrically connected with a first transmitting circuit formed in the first semiconductor chip; and
      a plurality of first receiving pads electrically connected with a first receiving circuit formed in the first semiconductor chip,
   wherein the second semiconductor chip has:
      a plurality of second transmitting pads electrically connected with a second transmitting circuit formed in the second semiconductor chip; and a plurality of second receiving pads electrically connected with a second receiving circuit formed in the second semiconductor chip, wherein the plurality of transformers of the third semiconductor chip has:

at least one or more first transformers used to transmit a signal from the first semiconductor chip to the second semiconductor chip; and at least one or more second transformers used to transmit a signal from the second semiconductor chip to the first semiconductor chip, wherein the primary coil of the one or more first transformers is electrically connected with the plurality of first transmitting pads of the first semiconductor chip, wherein the secondary coil of the one or more first transformers is electrically connected with the plurality of second receiving pads of the second semiconductor chip, wherein the primary coil of the one or more second transformers is electrically connected with the plurality of second transmitting pads of the second semiconductor chip, wherein the secondary coil of the one or more second transformers is electrically connected with the plurality of first receiving pads of the first semiconductor chip, wherein, in plan view, the one or more first transformers are arranged closer to the first semiconductor chip than the one or more second transformers, and wherein, in plan view, the plurality of first transmitting pads is arranged closer to the second semiconductor chip than the plurality of first receiving pads.

2. The semiconductor device according to claim 1, wherein, in plan view, the plurality of first transmitting pads and the plurality of first receiving pads are arranged along the first side of the first semiconductor chip.

3. The semiconductor device according to claim 2, wherein, in plan view, the plurality of second transmitting pads and the plurality of second receiving pads are arranged along the second side of the second semiconductor chip.

4. The semiconductor device according to claim 3, wherein, in plan view, the plurality of second receiving pads is arranged closer to the first semiconductor chip than the plurality of second transmitting pads.

5. The semiconductor device according to claim 1, wherein a number of the one or more second transformers is larger than a number of the one or more first transformers.

6. The semiconductor device according to claim 1, further comprising:

a plurality of leads; and a plurality of wires, wherein the sealing body seals a portion of each of the plurality of leads and the plurality of wires.

7. The semiconductor device according to claim 6, wherein the third semiconductor chip has:

a plurality of first pads electrically connected with the primary coil of the one or more first transformers;

a plurality of second pads electrically connected with the secondary coil of the one or more first transformers;

a plurality of third pads electrically connected with the primary coil of the one or more second transformers; and a plurality of fourth pads electrically connected with the secondary coil of the one or more second transformers, and wherein the plurality of wires includes:

a plurality of first wires electrically connecting the plurality of first transmitting pads with the plurality of first pads, respectively;

a plurality of second wires electrically connecting the plurality of second receiving pads with the plurality of second pads, respectively;

a plurality of third wires electrically connecting the plurality of second transmitting pads with the plurality of third pads, respectively; and a plurality of fourth wires electrically connecting the plurality of first receiving pads with the plurality of fourth pads, respectively.

8. The semiconductor device according to claim 7, wherein the first semiconductor chip further has a plurality of fifth pads, wherein the second semiconductor chip further has a plurality of sixth pads, wherein the plurality of wires further includes:

a plurality of fifth wires electrically connecting the plurality of fifth pads with a plurality of first leads of the plurality of leads, respectively; and a plurality of sixth wires electrically connecting the plurality of sixth pads with a plurality of second leads of the plurality of leads, respectively.

9. The semiconductor device according to claim 1, wherein the plurality of second transmitting pads is electrically connected with the primary coil of the one or more second transformers, respectively; and wherein the plurality of first receiving pads is electrically connected with the secondary coil of the one or more second transformers, respectively.

10. A semiconductor device comprising:

a first chip mounting portion;

a second chip mounting portion;

a first semiconductor chip mounted on the first chip mounting portion;

a second semiconductor chip mounted on the second chip mounting portion;

a third semiconductor chip mounted on the first chip mounting portion and having a plurality of transformers; and a sealing body sealing the first semiconductor chip, the second semiconductor chip, the third semiconductor chip, the first chip mounting portion and the second chip mounting portion, wherein each of the plurality of transformers has a primary coil and a secondary coil that are magnetically coupled to each other, wherein the first chip mounting portion and the second chip mounting portion are adjacent to each other in a first direction, wherein the first semiconductor chip and the third semiconductor chip are adjacent to each other in a second direction that is perpendicular to the first direction, wherein, in plan view, the third semiconductor chip has:

a third side facing a first side of the first semiconductor chip; and a fourth side facing a second side of the second semiconductor chip, wherein, in plan view, the plurality of transformers is arranged along the third side of the third semiconductor chip, wherein the first semiconductor chip has:

a plurality of first transmitting pads electrically connected with a first transmitting circuit formed in the first semiconductor chip; and a plurality of first receiving pads electrically connected with a first receiving circuit formed in the first semiconductor chip, wherein the second semiconductor chip has:

a plurality of second transmitting pads electrically connected with a second transmitting circuit formed in the second semiconductor chip; and a plurality of second receiving pads electrically connected with a second receiving circuit formed in the second semiconductor chip, wherein the plurality of transformers of the third semiconductor chip has:

at least one or more first transformers used to transmit a signal from the first semiconductor chip to the second semiconductor chip; and at least one or more second transformers used to transmit a signal from the second semiconductor chip to the first semiconductor chip, wherein the primary coil of the one or more first transformers is electrically connected with the plurality of first transmitting pads of the first semiconductor chip, wherein the secondary coil of the one or more first transformers is electrically connected with the plurality of second receiving pads of the second semiconductor chip, wherein the primary coil of the one or more second transformers is electrically connected with the plurality of second transmitting pads of the second semiconductor chip, wherein the secondary coil of the one or more second transformers is electrically connected with the plurality of first receiving pads of the first semiconductor chip, wherein, in plan view, the one or more second transformers are arranged closer to the second semiconductor chip than the one or more first transformers, and wherein, in plan view, the plurality of second transmitting pads is arranged closer to the first semiconductor chip than the plurality of second receiving pads.

11. The semiconductor device according to claim 10, wherein, in plan view, the plurality of second transmitting pads and the plurality of second receiving pads are arranged along the second side of the second semiconductor chip.

12. The semiconductor device according to claim 11, wherein, in plan view, the plurality of first transmitting pads and the plurality of first receiving pads are arranged along the first side of the first semiconductor chip.

13. The semiconductor device according to claim 12, wherein, in plan view, the plurality of first receiving pads is arranged closer to the second semiconductor chip than the plurality of first transmitting pads.

14. The semiconductor device according to claim 10, wherein a number of the one or more first transformers is larger than a number of the one or more second transformers.

15. The semiconductor device according to claim 10, further comprising:

a plurality of leads; and a plurality of wires, wherein the sealing body seals a portion of each of the plurality of leads and the plurality of wires.

16. The semiconductor device according to claim 15, wherein the third semiconductor chip has:

a plurality of first pads electrically connected with the primary coil of the one or more first transformers;

a plurality of second pads electrically connected with the secondary coil of the one or more first transformers;

a plurality of third pads electrically connected with the primary coil of the one or more second transformers; and a plurality of fourth pads electrically connected with the secondary coil of the one or more second transformers, and wherein the plurality of wires includes:

a plurality of first wires electrically connecting the plurality of first transmitting pads with the plurality of first pads, respectively;

a plurality of second wires electrically connecting the plurality of second receiving pads with the plurality of second pads, respectively;

a plurality of third wires electrically connecting the plurality of second transmitting pads with the plurality of third pads, respectively; and a plurality of fourth wires electrically connecting the plurality of first receiving pads with the plurality of fourth pads, respectively.

17. The semiconductor device according to claim 16, wherein the first semiconductor chip further has a plurality of fifth pads, wherein the second semiconductor chip further has a plurality of sixth pads, wherein the plurality of wires further includes:

a plurality of fifth wires electrically connecting the plurality of fifth pads with a plurality of first leads of the plurality of leads, respectively; and a plurality of sixth wires electrically connecting the plurality of sixth pads with a plurality of second leads of the plurality of leads, respectively.

18. The semiconductor device according to claim 10, wherein the plurality of first transmitting pads is electrically connected with the primary coil of the one or more first transformers, respectively; and wherein the plurality of second receiving pads is electrically connected with the secondary coil of the one or more first transformers, respectively.

* * * * *